United States Patent
Ahmed

(10) Patent No.: US 12,094,396 B2
(45) Date of Patent: Sep. 17, 2024

(54) DRIVING CIRCUIT FOR POWER EFFICIENT LED DISPLAY

(71) Applicant: Intel Corporation, Santa Clara, CA (US)

(72) Inventor: Khaled Ahmed, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 744 days.

(21) Appl. No.: 17/127,859

(22) Filed: Dec. 18, 2020

(65) Prior Publication Data

US 2022/0198995 A1 Jun. 23, 2022

(51) Int. Cl.
G09G 3/32 (2016.01)
H01L 25/075 (2006.01)
H01L 27/12 (2006.01)
H01L 29/786 (2006.01)

(52) U.S. Cl.
CPC ............ *G09G 3/32* (2013.01); *H01L 25/0753* (2013.01); *H01L 27/1225* (2013.01); *H01L 27/1255* (2013.01); *H01L 29/78672* (2013.01); *H01L 29/78681* (2013.01); *H01L 29/7869* (2013.01); *G09G 2300/0404* (2013.01); *G09G 2300/0443* (2013.01); *G09G 2310/0267* (2013.01); *G09G 2310/0275* (2013.01)

(58) Field of Classification Search
CPC ..................................................... G09G 3/32
See application file for complete search history.

(56) References Cited

U.S. PATENT DOCUMENTS

2019/0306945 A1\* 10/2019 Valentine ................. G09G 3/32

OTHER PUBLICATIONS

Akimoto et al., "An Innovative Pixel-Driving Scheme for 64-Level Gray-Scale Full-Color Active Matrix OLED Displays", Symposium Digest of Technical Papers, pp. 972-975, 2002.
Kageyam et al., "A 2.5-inch Lowpower LTPS AMOLED Display—using Clamped-Inverter Driving—for Mobile Applications", Symposium Digest of Technical Papers, pp. 1455-1458, 2006.
Kageyama et al., "A 2.5-inch OLED Display with a Three-TFT Pixel Circuit for Clamped Inverter Driving", Symposium Digest of Technical Papers, pp. 1394-1397, 2004.
Kageyama et al., "A 3.5-inch OLED Display using a 4-TFT Pixel Circuit with an Innovative Pixel Driving Scheme", Symposium Digest of Technical Papers, pp. 96-99, 2003.

(Continued)

*Primary Examiner* — Gustavo Polo
(74) *Attorney, Agent, or Firm* — Schwabe, Williamson & Wyatt, P.C.

(57) ABSTRACT

A micro-LED display having a plurality of pixels arranged in a two-dimensional matrix, wherein an individual pixel of the plurality of pixels each includes a light-emission section and a drive circuit to drive the light-emission section. The drive section includes an in-pixel PWM circuitry to receive a sawtooth or triangular pulse and an electric potential based on an image signal voltage, and to output a current pulse based on a comparison of the sawtooth or triangular pulse and the electric potential. The in-pixel PWM circuitry includes at most 7 transistors. The micro-LED display includes is coupled to one or more circuitries coupled to the plurality of pixels to provide the sawtooth or triangular pulse and the electric potential.

24 Claims, 20 Drawing Sheets

(56) References Cited

OTHER PUBLICATIONS

Kasai et al., "A Color Balance Control System for OLED with Clamped Inverter Method", Symposium Digest of Technical Papers, pp. 1460-1463, 2005.

Kohno et al., "Late-News Paper: 3.0-inch High-resolution Low-voltage LTPS AM-OLED Display with Novel Voltage-programmed Driving Architecture", Symposium Digest of Technical Papers, pp. 1382-1385, 2007.

* cited by examiner

DRIVING CIRCUIT FOR POWER EFFICIENT LED DISPLAY

BACKGROUND

In recent years, micro-light-emitting diode (μLED) display technology has been the focus of considerable research and development. Displays based on inorganic μLEDs have attracted increasing attention for applications in emerging portable electronics such as laptops and smartphones. μLED displays promise 3× less power compared to organic LED (OLED) displays. This saves battery life in mobile devices and enhances user experience. Among other advantages, micro-LED displays provide promising results in delivering bright colors and rich black levels while consuming three to five times less power than OLED displays.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
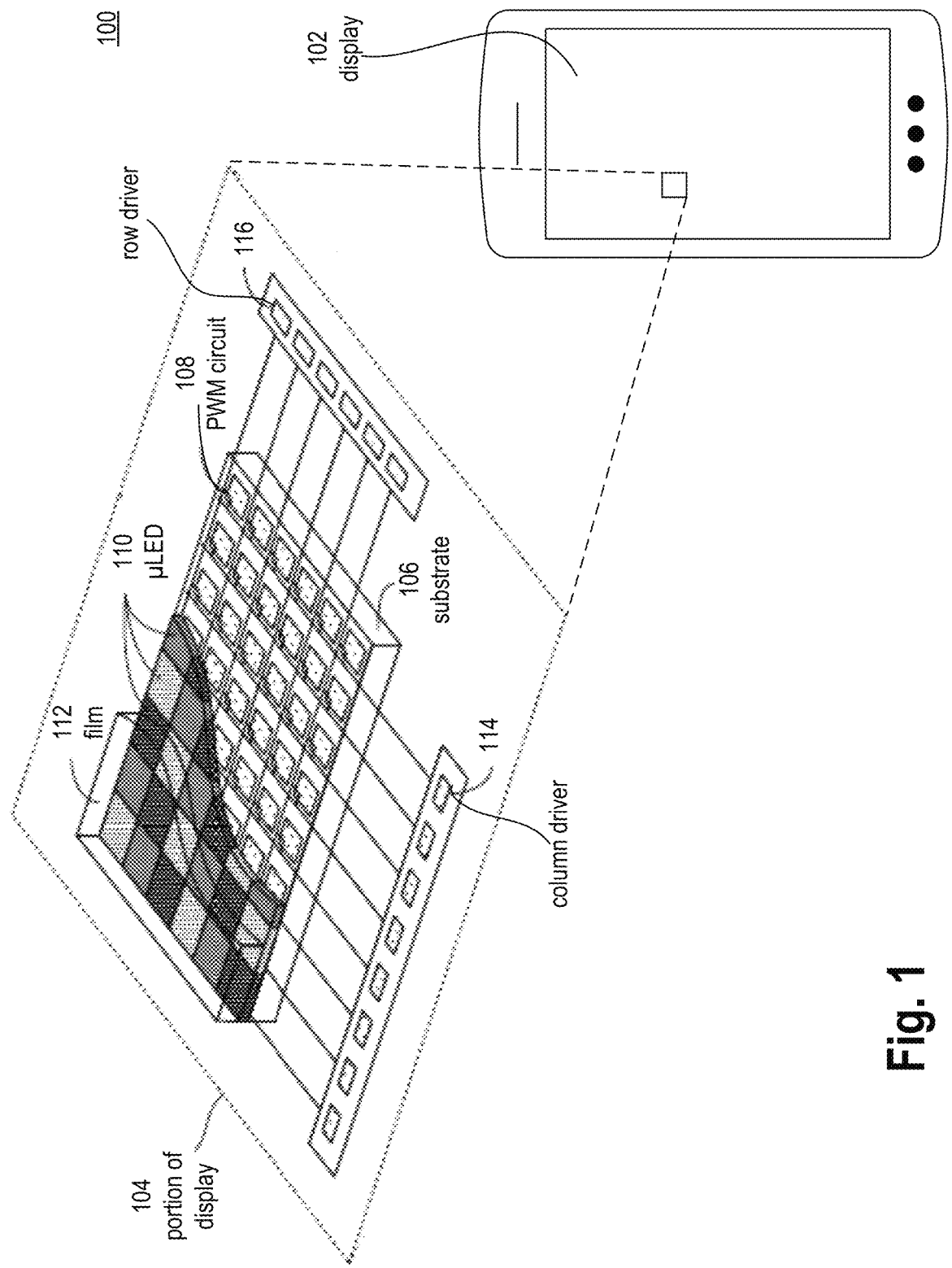
FIG. 1 illustrates an electronic device with a micro-LED (μLED) display, in accordance with some embodiments.

Micro-LED arrays produce their own light in response to current flowing through the individual micro-LED elements of the array. Electrically, micro-LED devices include inorganic structures that look like diodes with typical forward "on" voltage drops ranging from 1.9 volts (V) to 3 V depending on the color displayed. Unlike liquid crystal displays (LCDs), micro-LEDs are current driven devices. However, like common LCD panels, micro-LEDs may be arranged in a 2-dimensional array (e.g., matrix) of elements to form a display. Unlike organic LED (OLED) elements, micro-LED elements utilize inorganic compounds such as gallium nitride that are illuminated when supplied with current as opposed to organic compounds that are illuminated in OLED displays.

As used herein, the term micro-LED is not limited to a specific LED dimension. However, in some examples, the micro-LEDs have a dimension (e.g., a length and/or a width) that is less than 100 micrometers. For example, in some instances the micro-LEDs have a size that is less than or equal to 100 micrometers by 100 micrometers. In some in other examples, the micro-LEDs have a size that is less than or equal to 30 micrometers by 30 micrometers.

Active-matrix micro-LED displays use current control circuits integrated with the display itself, with one control circuit corresponding to each individual element on the substrate, to create high-resolution color graphics with a high refresh rate. This structure results in a matrix of devices, one (or more) device formed at each point where a row overlies a column.

There are at least M×N devices in a matrix having M rows and N columns. Typical micro-LED devices function like standard LEDs, which conduct current and luminesce when voltage of one polarity is imposed across them, and block current when voltage of the opposite polarity is applied.

To control individual micro-LED devices located at matrix junctions, it is useful to have two distinct driver circuits, one to drive the columns and one to drive the rows. It is conventional to sequentially scan the rows (typically conventionally connected to device cathodes) with a driver switch to a known voltage such as ground, and to provide another driver to drive the columns (which are typically conventionally connected to device anodes). In operation, information is transferred to the matrix display by scanning each row in sequence. During each row scan period, each column connected to an element intended to emit light is also driven.

To produce the perception of a grayscale or a full-color image using a micro-LED display at optimal power efficiency, the pixels of the display are rapidly modulated between on and off states such that the average of their modulated brightness waveforms correspond to the desired 'analog' brightness for each pixel. This technique is generally referred to as pulse-width modulation (PWM). Above a certain modulation frequency, the human eye and brain integrate a pixel's rapidly varying brightness (and color, in a field-sequential color display) and perceive a brightness (and color) determined by the pixel's average illumination over a period of time (e.g., over a display of a video frame).

PWM operation of micro-LEDs provides improvements in power efficiency when compared with analog driving. For example, the power efficacy of solid-state micro-LEDs drops significantly at very low current density (e.g., less than 1 A/cm2). This drop in efficacy can cause undesired high power consumption. The power efficacy typically peaks at a current density of ~1 A/cm2. Typical operating conditions use a current density of approximately 0.01 A/cm2 for display applications. At this low current level, the power efficacy is smaller than its optimal (peak) value. Similarly, driving micro-LEDs using pulses sent from column drivers across whole display lengths can cause undesired high-power consumption and pulse distortion, causing inaccurate dialing of image colors.

To address the drawbacks of analog circuits or PWM signals sent from column drivers across long traces, some micro-LED implementations include PWM circuits for each pixel implemented in silicon (Si) complementary metal-oxide-semiconductor (CMOS) and transferred from silicon wafers to a backplane. While this technique may work for large displays that include large pixels (e.g., televisions), as the pixel size decreases, such techniques become infeasible to make small enough for products such as laptops and smartphones due to the transistor count of the circuits when implemented with thin-film transistor (TFT) technology. For example, for high pixel per inch (PPI) resolution displays, the pulse width can be less than 10 ns, which is comparable to the micro-LED response time. Consequently, pulse density modulation scheme may not work. PWM circuits currently in use have too many transistors and cannot fit into a display pixel, especially for high resolution displays (e.g., 13.3 inches scheme with resolution of 2560×1400).

Examples disclosed herein, utilize in-pixel circuits to convert a low-frequency driving signal (e.g., a sawtooth or triangular pulse) sent from a column driver into a pulse-width modulated circuit to drive micro-LEDs. In some examples, the image data to be displayed is represented by a DC voltage that is produced by a digital-to-analog converter (DAC). The input to the DAC may be provided by a timing control (TCON) circuit.

Some embodiments, methods, systems, and apparatus for gray scale modulation at optimal power efficiency for µLED displays. Instead of sending very short pulses (high frequency signal) from column drivers to each pixel down each column in the active matrix of µLEDs, some embodiments use an ultra-compact in-pixel circuit that converts a low-frequency sawtooth or triangular pulses sent from the column drivers into a pulse-width modulated circuit to drive the µLEDs. In some embodiments, the image data is represented by a DC voltage that is produced by a digital-to-analog converter (DAC). The input to the DAC comes from a Timing Controller (TCON) chip. One in-pixel PWM driver circuit comprises at most seven TFTs. For example, an in-pixel PWM driver circuit has four n-channel TFTs that could be made with Low Temperature PolySilicon (LTPS) of indium gallium zinc oxide (IGZO) TFTs, and three p-channel TFTs that could be made with LTPS TFTs. In some embodiments, an in-pixel PWM driver circuit is described that has at most three TFTs.

In some embodiments, a display circuitry is provided which comprises a plurality of pixels arranged in a two-dimensional matrix, wherein an individual pixel of the plurality of pixels each includes a light-emission section and a drive circuit to drive the light-emission section. In some embodiments, the drive section includes an in-pixel PWM circuitry that receives a sawtooth or triangular pulse and an electric potential based on an image signal voltage, and outputs a current pulse based on a comparison of the sawtooth or triangular pulse and the electric potential. In some embodiments, the in-pixel PWM circuitry includes at most seven transistors. In some embodiments, the in-pixel PWM circuitry includes at most three transistors. In some embodiments, the display circuitry includes one or more circuitries coupled to the plurality of pixels to provide the sawtooth or triangular pulse and the electric potential.

In some embodiments, the in-pixel PWM circuitry comprises a first n-type transistor to receive the electric potential based on the image signal voltage, and controllable by a scan node. In some embodiments, the in-pixel PWM circuitry comprises a second n-type transistor having a gate terminal couples to a source or drain of the first n-type transistor, wherein a source terminal of the second n-type transistor is to receive the sawtooth or triangular pulse. In some embodiments, the in-pixel PWM circuitry comprises a p-type transistor coupled in series with the second n-type transistor, wherein a gate of the p-type transistor is controllable by a bias voltage. In some embodiments, the second n-type transistor and the p-type transistor is coupled to one or more micro-LEDs. In some embodiments, the pixels are arranged in a two-dimensional matrix in a first direction and a second direction. In some embodiments, the light-emission section includes a micron-size light emitting diode. In some embodiments, the PWM circuitry includes thin film transistors on a display backplane. In some embodiments, the PMW circuitry includes low temperature polysilicon thin film transistors. In some embodiments, the PWM circuitry includes n-channel transistors and p-channel transistors. In some embodiments, the n-channel or p-channel transistors includes one of: low temperature polysilicon, InP, GaP, GaN, or IGZO thin film transistors. In some embodiments, the plurality of pixels has an area that is below approximately 30 µm×30 µm.

There are many technical effects of various embodiments. For example, transistors in the in-pixel PWM driver circuit are operate in strong inversion operating regime, which is more stable and less vulnerable to variability. The in-pixel PWM driver circuit of some embodiments consume small area that allow those circuits to fit in high resolution displays (e.g. 13.3" laptop with resolution of 2560×1440 (QHD)) while providing high power efficiency. In some examples disclosed herein, the micro-LEDs may be driven a current level that provide high efficiency outputs driven by PWMs. In such circuits, the PWM signals may be generated at the pixel without the distortion and high-power consumption associated with transmitting high frequency PWM signals across an entire display. Instead, examples disclosed herein utilize a lower frequency signal to drive the in-pixel circuit that generates the higher frequency PWM signal. The PWM has other great benefits such as avoiding color shift that is typically observed for LEDs. When constant current (and different pulse widths) are forced, the color for a given LED is fixed. This is valuable for high current. At very low current, the color shift is very small. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

It is pointed out that those elements of a figure having the same reference numbers (or names) as the elements of any other figure may operate or function in any manner similar to that described, but are not limited to such.

FIG. 1 illustrates electronic device 100 with a micro-LED (μLED) display 102, in accordance with some embodiments. The electronic device 100 may be any type of electronic device that includes a display such as a laptop, a tablet, a smartphone, a smartwatch, a television, a computer monitor, etc. The illustrated example of FIG. 1 also includes a partially cutaway close up 104 of a portion of micro-LED display 102. In some embodiments, display 102 includes an underlying substrate 106 that carries a plurality of transistor-based in-pixel driver circuits 108 with a grid of wires used to drive the individual in-pixel driver circuits 108 and, thereby, pixels (or subpixels) of display 102.

According to the illustrated examples, pixel driver circuits 108 are implemented using TFTs applied to the substrate 106. Example implementations of in-pixel driver circuits 108 are described in conjunction with FIGS. 4-14.

In some embodiments, an array of red, green, and blue micro-LEDs 110 is electrically coupled to in-pixel driver circuits 108. As mentioned herein, in some examples, micro-LEDs 110 of display 102 may also include infrared micro-LEDs. Each individual micro-LED 110 corresponds to a different pixel (or subpixel) of display 102 that is driven by in-pixel driver circuit 108. In some embodiments, on top of the micro-LEDs 110 (opposite substrate 106 and in-pixel driver circuits 108) is a transparent conductive film 112.

In some embodiments, pixel driver circuits 108 are driven by column drivers 114 and row drivers 116. For example, column drivers 114 supply a low frequency signal (e.g., a sawtooth wave signal, a triangular/triangle wave signal, etc.) while row drivers 116 supply a scan signal to selectively pass a data signal representative of an image to be displayed to activate the pixels of particular row of display 102. For example, the data signal may be supplied to display 102 from a digital-to-analog (DAC) to drive display 102 to display an image initially represented in digital data.

A DAC is an apparatus that converts digital data (e.g., binary or thermometer coded) into an analog signal (current, voltage, or electric charge). Here, an analog signal generally refers to any continuous signal for which the time varying feature (variable) of the signal is a representation of some other time varying quantity, i.e., analogous to another time varying signal. A digital signal is a physical signal that is a representation of a sequence of discrete values (a quantified discrete-time signal), for example of an arbitrary bit stream, or of a digitized (sampled and analog-to-digital converted) analog signal. In some embodiments, the DAC is a pulse width modulator DAC. In other embodiments, other types of DACs may be used for implementing the DACs that provides the data signal. For example, interpolating DACs (also known as oversampling DACs), binary weighted DACs (e.g., switched resistor DACs, switched capacitor DACs, switched current-source DACs), R-2R ladder DAC, thermometer coded DAC, segmented DAC, etc. may be used for implementing the DAC that provides the data signal for display 102.

In some embodiments, in-pixel driver circuits 108 convert the low frequency signal into a higher frequency PWM signal having a pulse that is based on the DC voltage of the input data signal. In some embodiments, the amplitude of the PWM signal is fixed at a level that drives micro-LEDs 110 at efficient operating current and the brightness and/or color of micro-LEDs 110 is controlled by the pulse width of the PWM signal.

Figure 2:
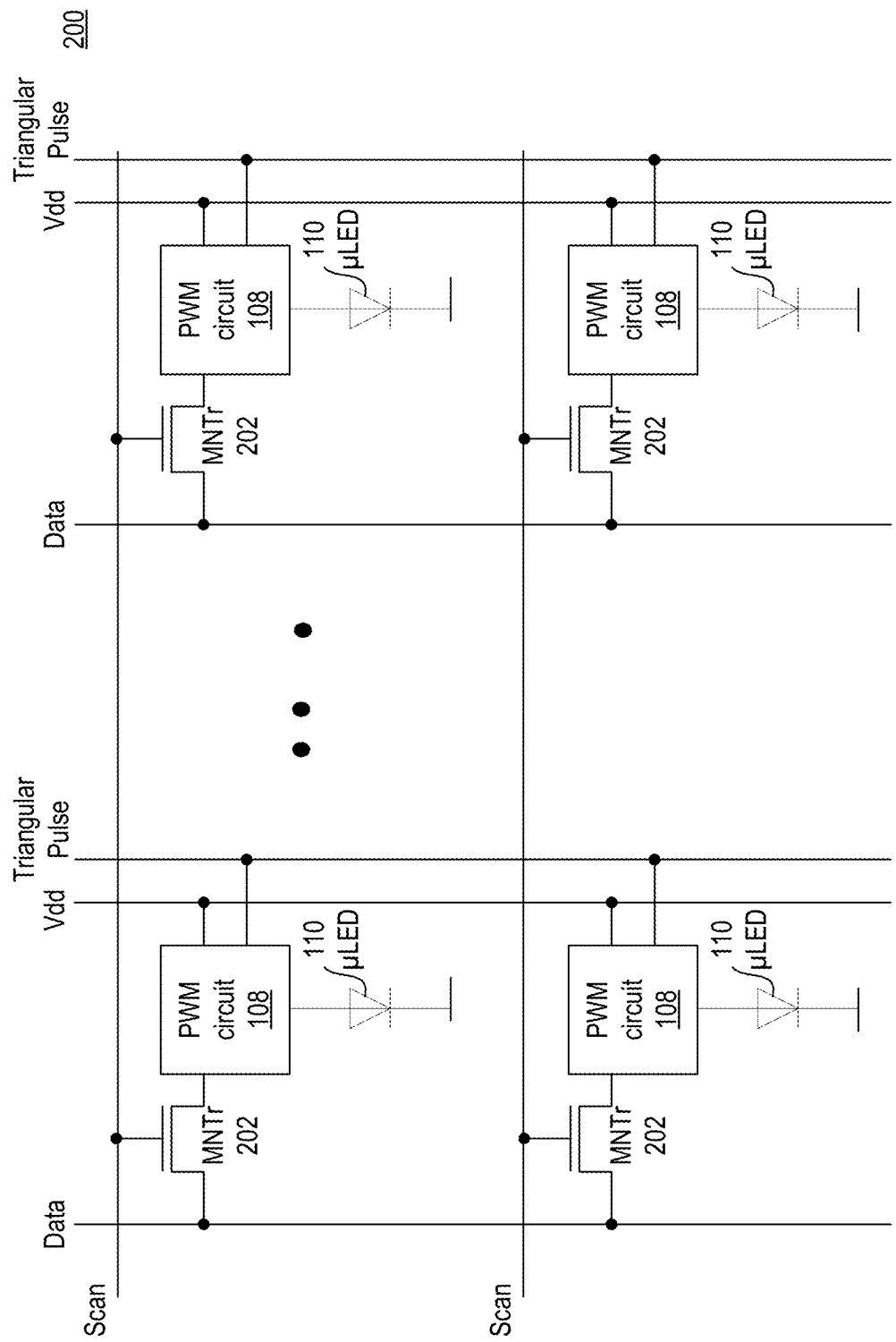
FIG. 2 illustrates an apparatus having an in-pixel driver circuit to drive a μLED display, in accordance with some embodiments.

FIG. 2 illustrates apparatus 200 with an in-pixel driver circuit to drive a μLED display, in accordance with some embodiments. Here, the term "in-pixel driver" refers to a PWM driver which is integrated with the pixel as opposed to a PWM driver which is positioned away from substrate 106. The example in-pixel driver circuits 108 are coupled to the example micro-LEDs 110. The example in-pixel driver circuits 108 are coupled to Data signals via respective switching transistors MNTr 202. The switching transistors MNTr 202 are operated by Scan signals (e.g., supplied by row drivers 116). In some embodiments, switching transistors MNTr 202 are N-channel Thin Film Transistor (TFT) transistors. Any number and dimension of micro-LEDs 110 may be implemented in an example (e.g., a 1080p display may include a matrix of 1,920 columns and 1,080 rows of micro-LEDs 110). Furthermore, while a single micro-LED 110 is shown for each in-pixel driving circuit 108, multiple micro-LEDs 110 may be connected to the in-pixel driving circuit 108 in parallel (e.g., to provide redundancy in case one micro-LED 110 is defective or otherwise fails to operate).

In operation, data signals having DC values representative of pixels to be displayed are supplied to columns of switching transistors MNTr 202 (e.g., a first data signal is supplied to a first column and a second data signal is supplied to a second column). The row corresponding to the supplied data signals (e.g., a first row to be scanned) is supplied with a Scan signal that activates the switching transistors MNTr 202 of the row to supply the data signals to the in-pixel driver circuits 108 of the row. In some embodiments, in-pixel driver circuits 108 convert triangular (Tr) signals (e.g., supplied by the example column drivers 114) into PWM signals having respective pulses based on the amplitude of the supplied data signals. The PWM signals are supplied to the example micro-LEDs 110.

Figure 3:
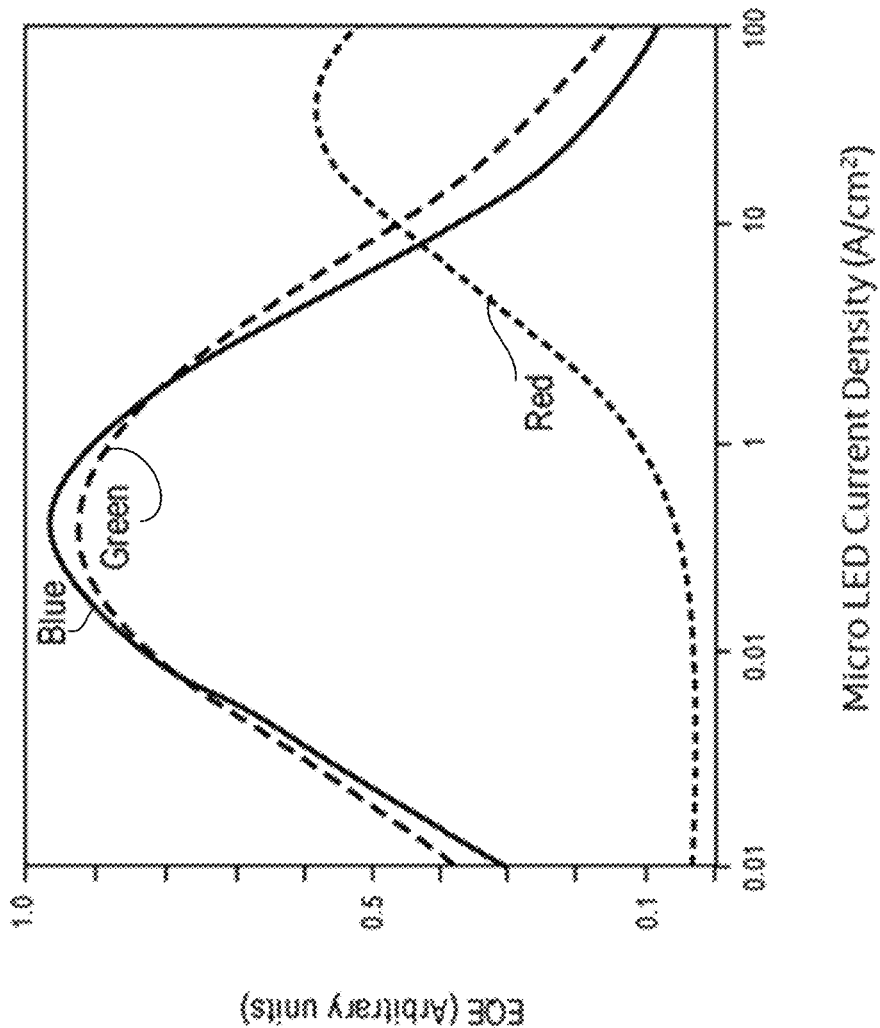
FIG. 3 illustrates a plot showing quantum efficiency of vs. current density for green, rend, and blue color μLED devices.

FIG. 3 illustrates plot 300 showing quantum efficiency of vs. current density for green, rend, and blue color μLED devices. If the brightness demands forcing a current density that is smaller than ~1 A/cm$^2$ in this case, μLED 110 will operate under sub-optimal conditions (i.e. lower power efficacy).

Figure 4:
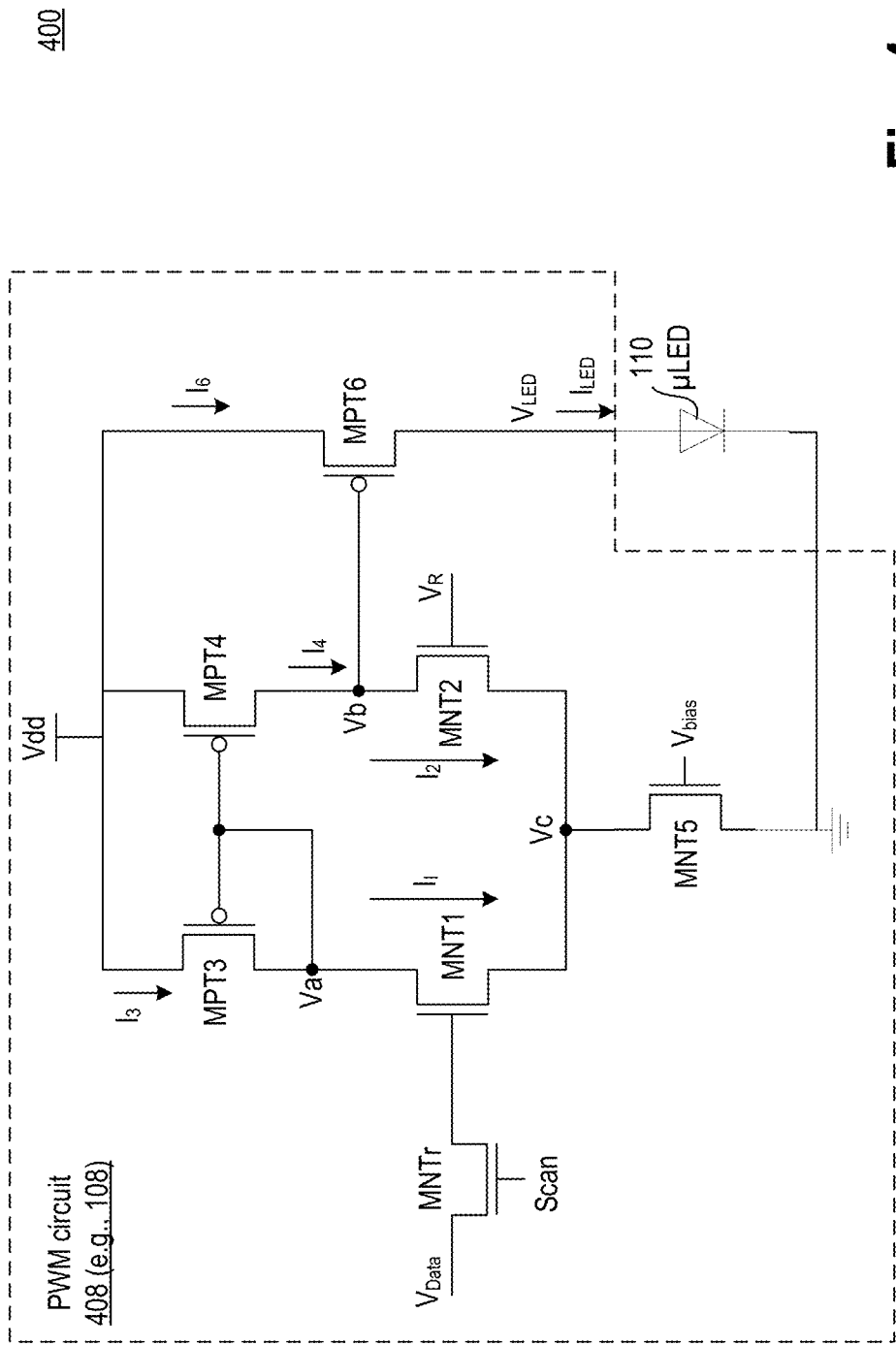
FIG. 4 illustrates an apparatus having an in-pixel pulse width modulation (PWM) circuit, in accordance with some embodiments.

FIG. 4 illustrates apparatus 400 showing an in-pixel pulse width modulation (PWM) circuit, in accordance with some embodiments. Apparatus 400 comprises PWM circuit 408 (e.g., 108) and micro-LED 110. Here, PWM circuit 408 is inside each pixel, and hence referred to in-pixel. In some embodiments, PWM circuit 408 comprises n-type transistors MNTr, MNT1, MNT2, and MNT5, p-type transistors MPT3, MPT4, and MPT6, nodes $V_a$, $V_b$, $V_c$, $V_R$, Scan (or $V_s$), $V_{bias}$, $V_{LED}$, $V_{data}$, and Vdd coupled as shown. Here, signal names and node names are interchangeably used. For example, $V_{LED}$ may refer to voltage $V_{LED}$ or node $V_{LED}$ depending on the context of the sentence.

The input to transistor MNT1 is a DC voltage representing image data coming from a DAC. The input to transistor MNT2 is a sawtooth or triangular signal $V_R$ coming from column drivers 114. Transistors MPT3 and MPT4 form a current mirror. The voltage on node $V_b$ biases transistor MPT6 which generates $I_{LED}$. A current pulse is forced into the µLED 110. The pulse width is determined by the input to transistor MNT1 and sawtooth signal frequency and magnitude. Transistors MPT3, MPT4, MNT1, and MNT2 form a differential pair or differential amplifier. The current source is implemented by transistor MNT5. Transistor MNT5 is biased by Vbias. Vbias can be generated by any suitable reference generator. The bias voltage Vbias is set to operate transistor MNT5 in saturation region. The output impedance of transistor MNT5 as observed at node Vc is high (e.g., few mega-Ohms at low frequencies). Difference in voltages $V_R$ and $V_{data}$ causes a difference in currents $I_3$ and $I_4$, and that difference causes current $I_6$ through MPT6 to change. As voltage $V_{data}$ increases relative to $V_R$, current $I_6$, and thus $I_{LED}$ increases. $V_{data}$ is a first input which is DC voltage that represents image data for a particular subpixel to be activated. Here, $V_R$ is a second input which is a sawtooth signal (or another low frequency signal). In some embodiments, the frequency of the second input voltage $V_R$ is based on a frame rate and a number of rows of the display 102.

In some embodiments, the frequency of the second input voltage $V_R$ is generated by hardware logic, machine readable instructions, hardware implemented state machines, and/or any combination. This hardware logic may be implemented by column driver 114, in some embodiments. In some embodiments, the machine-readable instructions, for generating the frequency of the second input voltage $V_R$, may be one or more executable programs or portion(s) of an executable program for execution by a computer processor such as SoC 5501 discussed with reference to FIG. 18.

Referring back to FIG. 1, in some embodiments, column driver 114 determines a frame rate for display 102. The frame rate may be a fixed value for display 102, may be a variable value set by a user setting of display 102, may be selected based on a frame rate of content to be displayed on the display 102, etc. In some embodiments, column driver 114 determines a number of rows for display 102. The number of rows for display 102 is typically fixed and may be stored as a fixed parameter. Alternatively, if display 102 is adjusted to utilize a variable number of rows (e.g., part of display 102 may be disabled), the number of rows may be a variable value. In some embodiments, column driver 114 determines a frequency for the driving signal based on the determined frame rate and the determined number of rows in the display. In one example, the frequency of the driving signal (e.g., a triangular wave signal) is determined as the number of rows for the display multiplied by the frame rate. In some embodiments, column driver 114 then sends the driving signal having the determined frequency to a column of in-pixel driver circuits 108. According to the illustrated example, the driving signal is emitted whenever the display 102 is operated.

In some embodiments, the transistors MNTr, MNT1, MNT2, and MNT5 are n-channel TFTs and the transistors MPT3 and MPT4 are p-channel TFTs. The example n-channel TFTs may be made of low-temperature polycrystalline oxide (LTPO), low temperature polycrystalline silicon (LTPS), indium phosphide (InP), gallium phosphide (GaP), gallium nitride (GaN), or indium gallium zinc oxide (IGZO) think-film transistors and the example p-channel TFTs may be made of low-temperature polycrystalline oxide (LTPO), low temperature polycrystalline silicon (LTPS), indium phosphide (InP), gallium phosphide (GaP), or gallium nitride (GaN).

Figure 5:
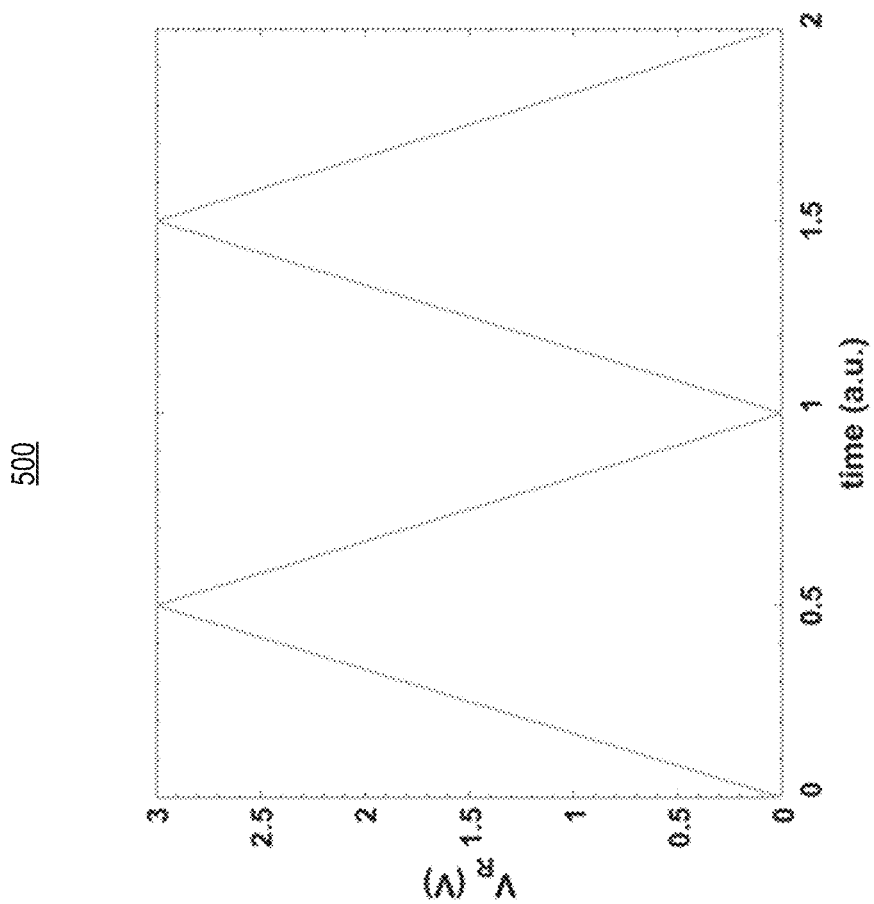
FIG. 5 illustrates a plot showing sawtooth signal applied to the in-pixel driver circuit to drive a μLED display, in accordance with some embodiments.

FIG. 5 illustrates plot 500 showing sawtooth signal applied to the in-pixel driver circuit to drive a µLED display, in accordance with some embodiments. In this example, the sawtooth wave applied at $V_R$ node has a period of approximately 12 micro seconds. When the input voltage at the gate of MNT1 is 0, 1.5 V, or 3 V, current pulses with different widths flow into the micro LEDs 11 connected at the output node WED.

Figure 6:
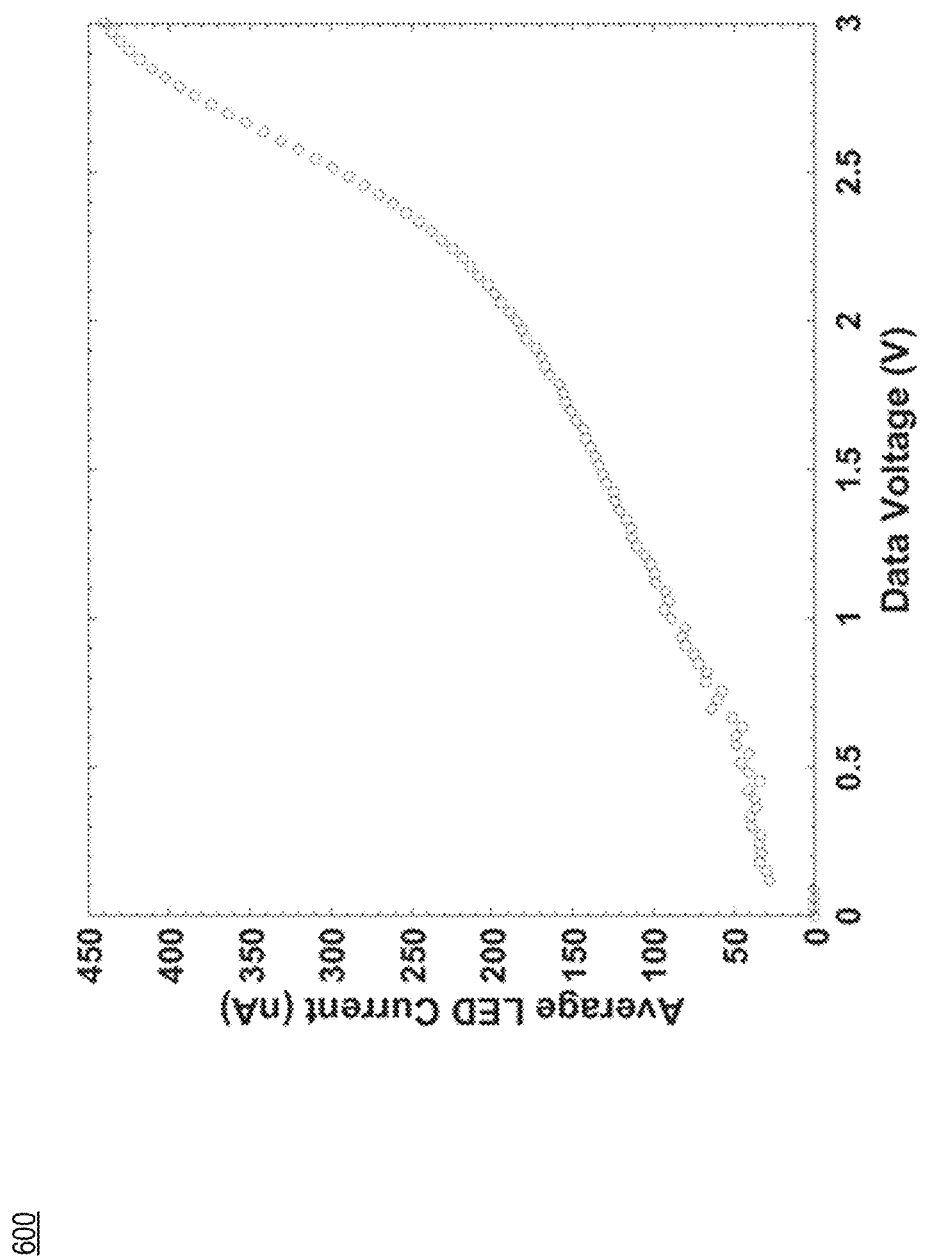
FIG. 6 illustrates a plot showing output current signal (average) as a function of the input data voltage, in accordance with some embodiments.

FIG. 6 illustrates plot 600 showing output current signal (average) as a function of the input data voltage, in accordance with some embodiments. Plot 600 shows that as voltage level of $V_{data}$ increase, the average current through LED 110 increases, which increase the brightness in display 102 perceived by a human eye.

Figure 7A:
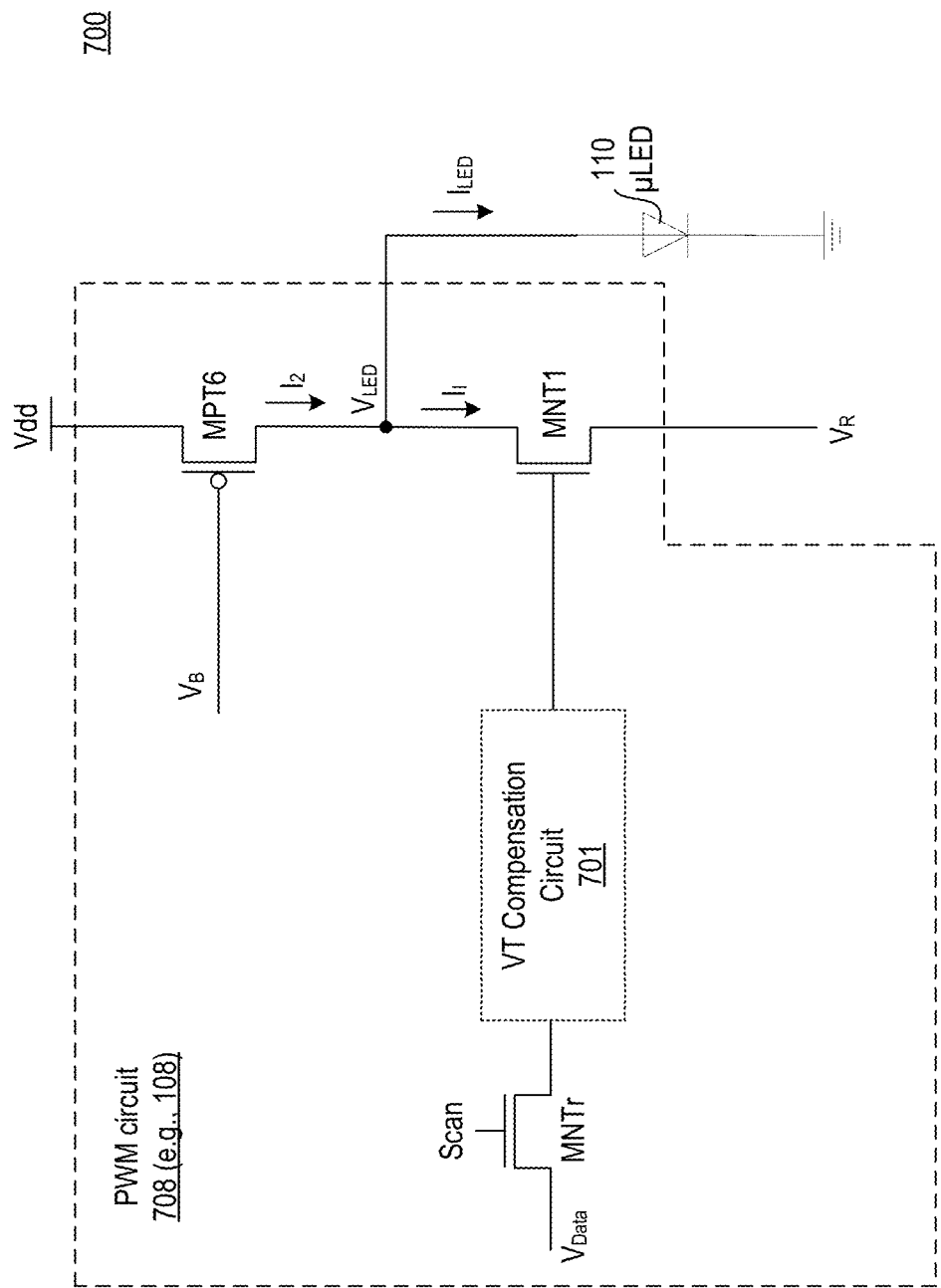
FIG. 7A illustrates an apparatus having 3T (three transistor) in-pixel driver circuit to drive a μLED display, in accordance with some embodiments.

FIG. 7A illustrates apparatus 700 with a 3T (three transistor) in-pixel driver circuit to drive a µLED display, in accordance with some embodiments. This alternative topology for in-pixel pulse width modulator circuit is implemented using three transistors. The implementation may be done using LTPS TFTs or LTPO TFTs. A triangular pulse ($V_R$) is applied to the source of MNT1 and data input ($V_{data}$). is applied to the gate of MNT1. A micro-LED current pulse $I_{LED}$ is generated with a pulse width determined by the value of the data voltage ($V_{data}$). In some embodiments, $V_b$ is a bias voltage for MPT6 generated by any suitable reference generation circuit. In some embodiments, a threshold (VT) compensation circuit 701 is inserted between transistor MNTe and MNT1 to compensate for variation in VT in MNT1.

In some embodiments, VT compensation circuit 701 comprises one or more capacitors coupled to the source/drain terminal of MNTr and gate of MNT1. In some embodiments, the capacitor is coupled to the gate of MNT1 and ground. In some embodiments, VT compensation circuit 701 is removed and replaced with a wire connecting the source/drain terminal of MNTr and gate of MNT1. The capacitance of the capacitor is programmable, in accordance with some embodiments. In some embodiments, in addition or alternatively, another capacitor is added in series between the gate of MNT1 and source/drain of MNTr. The capacitor can be implemented in any suitable way. For example, the capacitor(s) is implemented by transistors configured as capacitors, metal-insulator-metal (MIM) capacitors, ferroelectric capacitors, etc.

In some embodiments, instead of $V_R$ compensation circuit 701, a memory cell (not shown) is added. The memory cell can be any suitable memory cell such as a volatile or non-volatile memory cell. In some embodiments, the memory cell maintains a data output at the gate of transistor MNT1 without the need to refresh the driving signal when the image to be displayed is static. The emit rate of the example circuit 700 in that example is substantially equal to the scan rate applied.

Figure 7B:
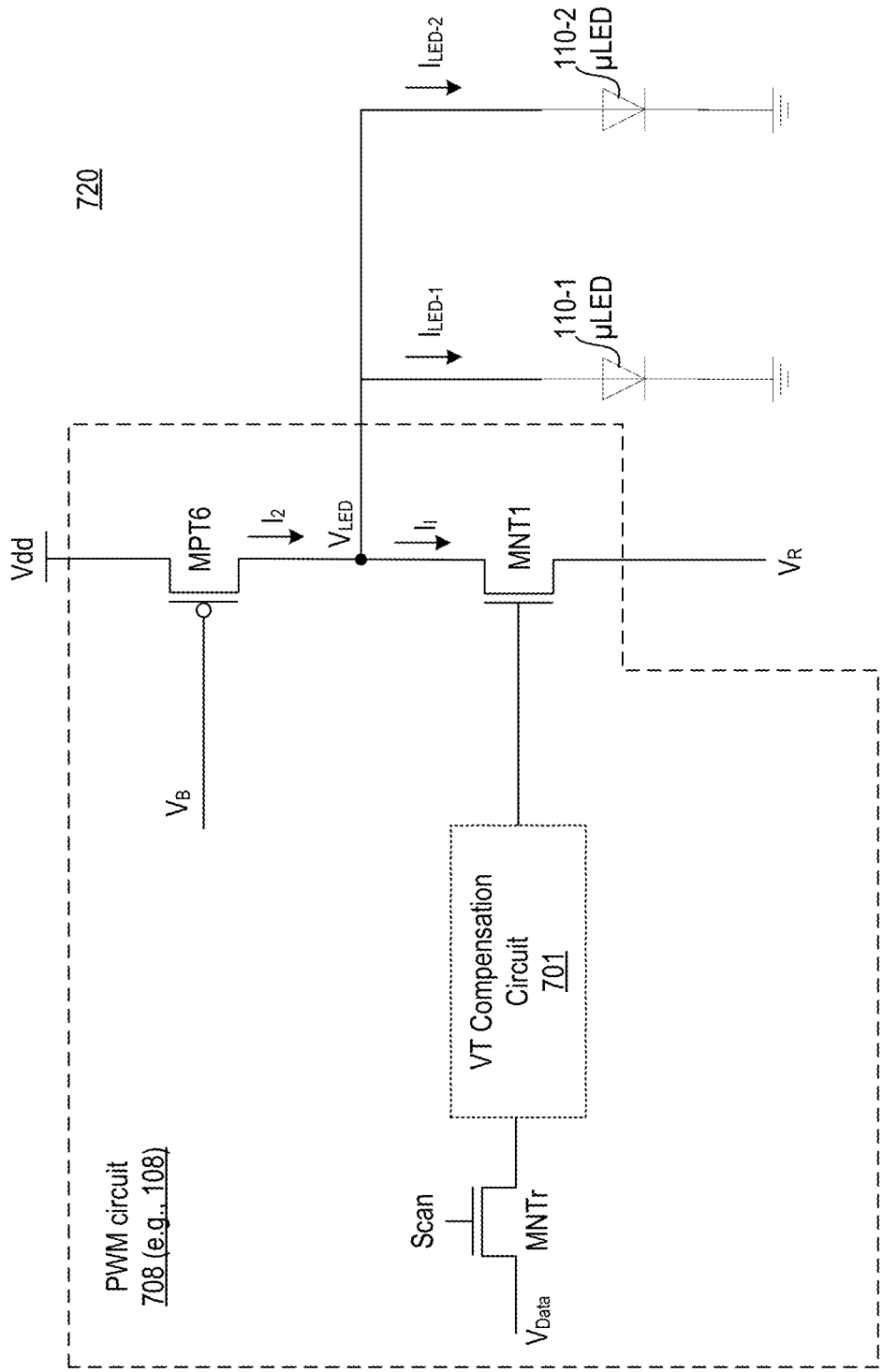
FIG. 7B illustrates an apparatus with 3T in-pixel driver circuit to drive a μLED display with redundant μLEDs, in accordance with some embodiments.

FIG. 7B illustrates apparatus 720 with 3T in-pixel driver circuit to drive a µLED display with redundant µLEDs, in accordance with some embodiments. In this example, two μLEDs 110-1 and 110-2 are used in parallel to replace the single μLED 110. The two μLEDs 110-1 and 110-2 are added for redundancy. So, if one μLED fails, another one can continue to operate. The brightness or intensity of the two μLEDs 110-1 and 110-2 is substantially the same as the brightness or intensity of the single LED because the currents $I_{LED-1}$ and $I_{LED-2}$ are divided between the two μLEDs 110-1 and 110-2.

Figure 7C:
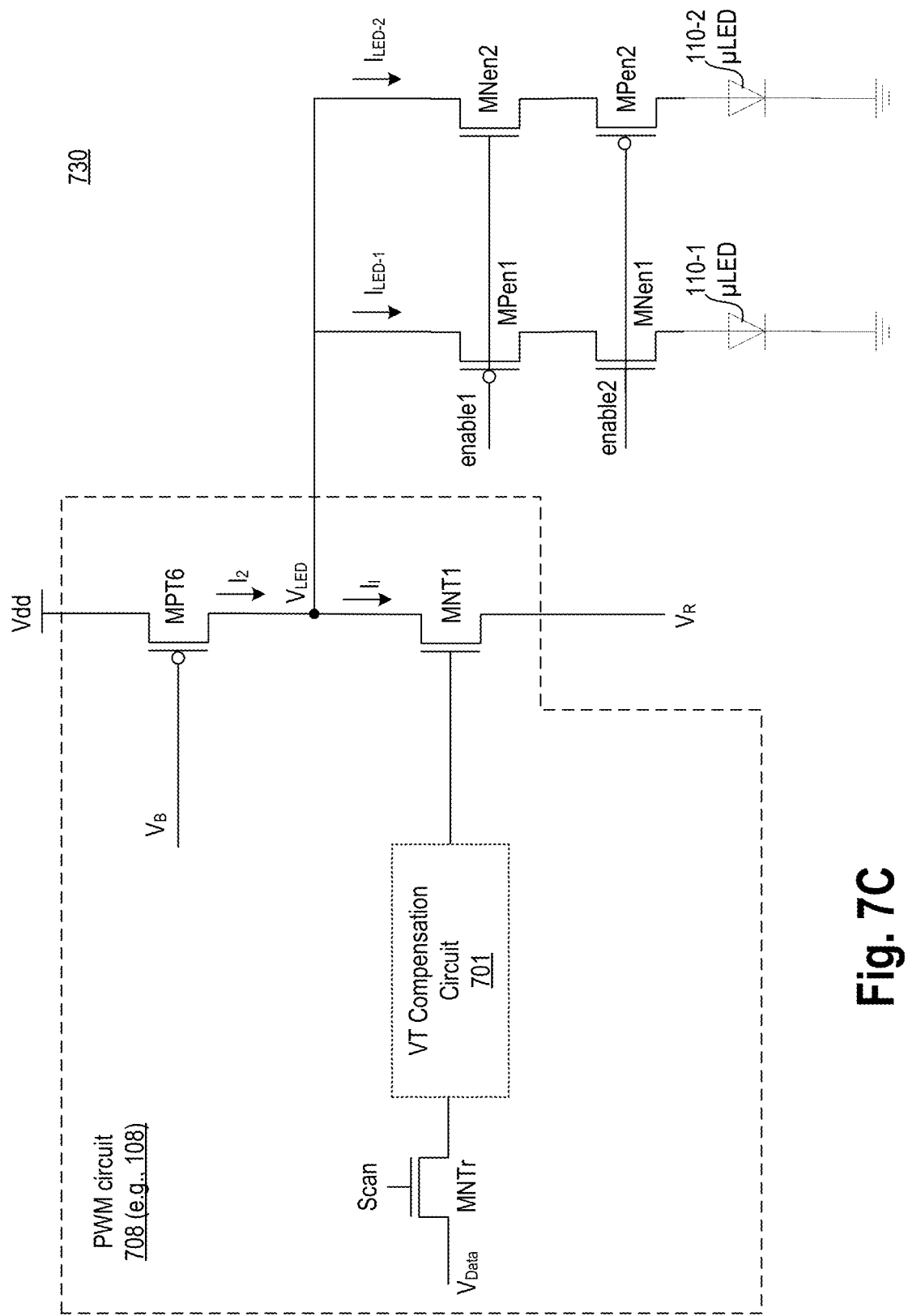
FIG. 7C illustrates an apparatus with 3T in-pixel driver circuit to drive a μLED display with redundant μLEDs that can be enabled or disabled, in accordance with some embodiments.

FIG. 7C illustrates apparatus 730 with 3T in-pixel driver circuit to drive a μLED display with redundant μLEDs that can be enabled or disabled, in accordance with some embodiments. In some embodiments, n-type transistor MNen1 and p-type transistor MPen1 are coupled in series with μLED 110-1, and n-type transistor MNen2 and p-type transistor MPen2 are coupled to μLED 110-2. Transistors MPen1 and MNen2 are controllable by enable1, while transistors MNen1 and MPen2 are controllable by enable2. When the transistors MNen1 and MPen1 coupled to the micro-LED 110-1 are enabled (e.g., enable 1 is high and enable 2 is low), first micro-LED 110-1 is driven and second micro-LED 110-2 is not driven. When transistors MNen2 and MPen2 coupled to second micro-LED 110-2 are enabled (e.g., enable 1 is low and enable 2 is high), second micro-LED 110-2 is driven and first micro-LED 110-1 is not driven. In some embodiments, in-pixel driver circuit 708 utilizes an emit rate that two times the scan rate to reduce flicker. For example, during each scan of a row, enable 1 and enable 2 will be sequentially enabled to illuminate the first micro-LED 110-1 and then second micro-LED 110-2 (e.g., both micro-LEDs will be illuminated one at a time during each scan). As shown here, micro-LED 110 can be replaced with any number of parallel micro-LEDs to provide fault tolerance and redundancy. So, if one LED fails to operate, another LED (or other LEDs) can provide the necessary light.

Figure 8:
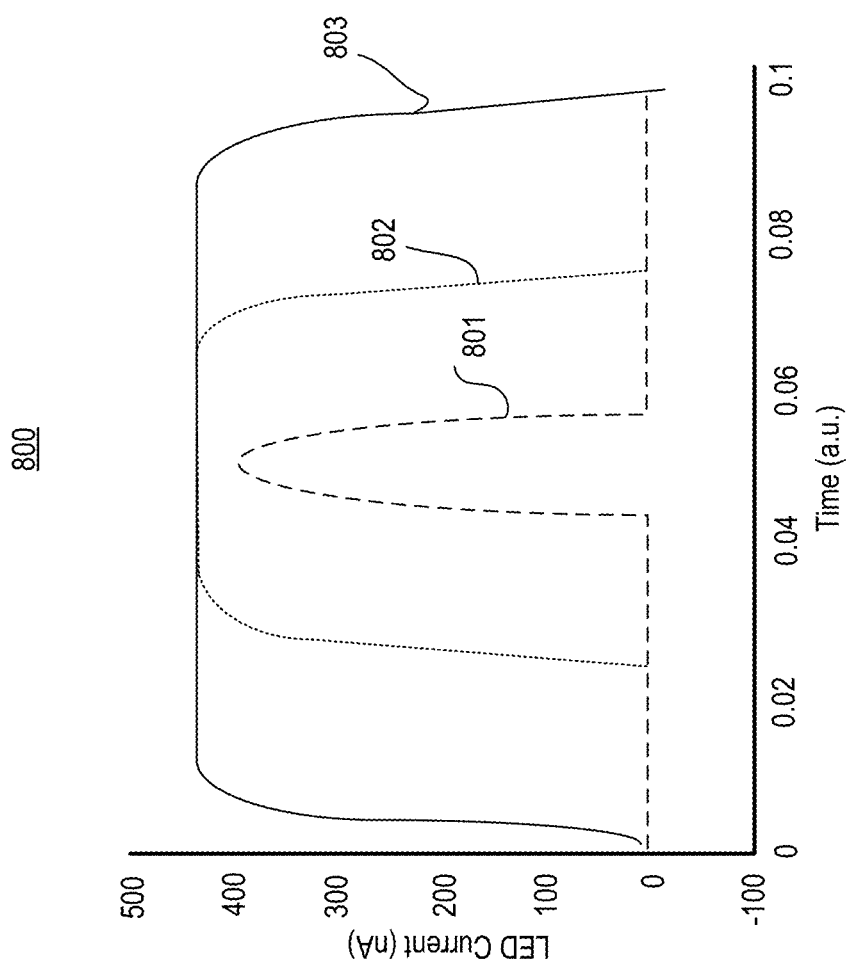
FIG. 8 illustrates a plot showing pulse width modulated signal for different values of input data voltage for 3T in-pixel driver circuit, in accordance with some embodiments.

FIG. 8 illustrates plot 800 showing pulse width modulated (PWM) signal for different values of input data voltage for 3T in-pixel driver circuit, in accordance with some embodiments. The output PWM signals 801, 802, and 803 are from in-pixel driver circuit 708 of FIG. 7. In this example, first output PWM signal 801 is the output of the in-pixel driver circuit 108 when data signal VData having DC voltage of near 0V is supplied to node Vdata. The example first output PWM signal 801 generates a blue light emission from the example micro-LED 110. The second output PWM signal 802 is the output of the in-pixel driver circuit 108 when the data signal having DC voltage of 1.5V is supplied to the example the Vdata node. The example second output PWM signal 802 generates a red light emission from the example micro-LED 110. The example third output PWM signal 803 is the output of the in-pixel driver circuit 108 when the data signal having DC voltage of 3V is supplied to the Vdata node. The example third output PWM signal 803 generates an orange light emission from the example micro-LED 110.

Figure 9:
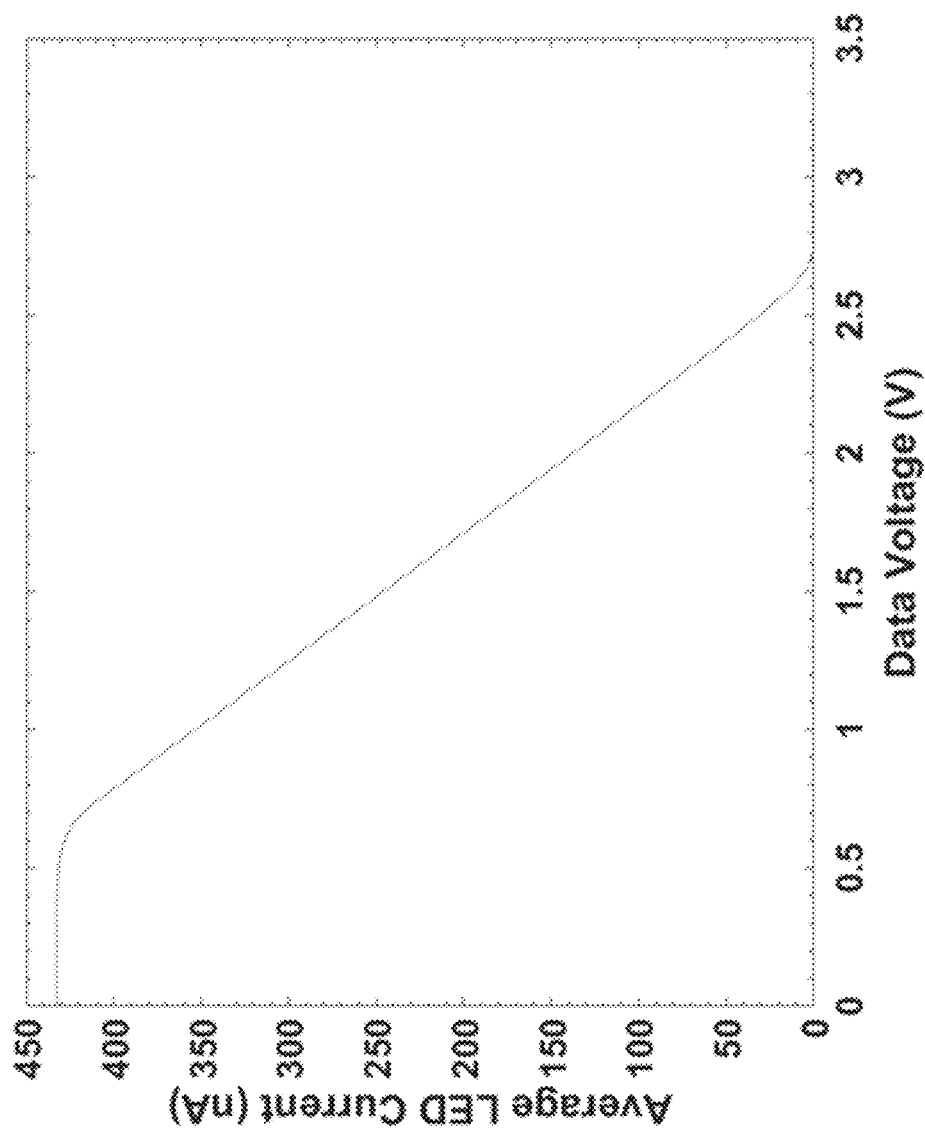
FIG. 9 illustrates a plot showing average LED current versus input data voltage for the 3T in-pixel driver circuit, in accordance with some embodiments.

FIG. 9 illustrates plot 900 showing average LED current versus input data voltage for the 3T in-pixel driver circuit, in accordance with some embodiments.

Figure 10:
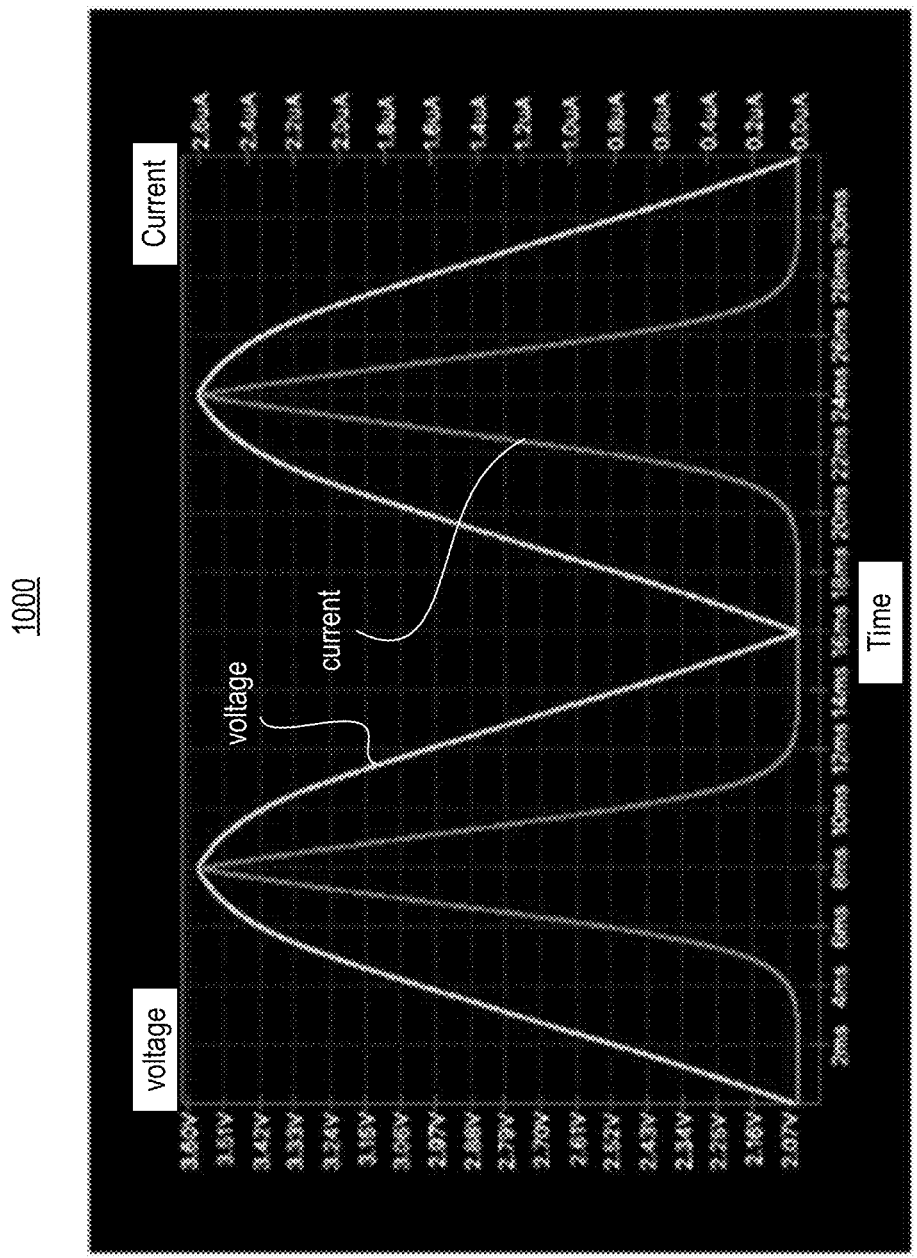
FIG. 10 illustrates a plot showing pulse width modulation by 3T in-pixel driver circuit, in accordance with some embodiments.

FIG. 10 illustrates plot 1000 showing pulse width modulation by 3T in-pixel driver circuit, in accordance with some embodiments. In this example, input voltage is 3V. Frequency of triangular wave is 60 Hz. Plot 1000 shows current and voltage, which illustrate pulse width modulation.

The following section describes a low cost and high-resolution micro-LED display with IGZO TFTs. In some embodiments, to reduce cost of micro-LED display, LTPS TFTs are replaced with amorphous IGZO (or metal oxides in general) TFTs. Amorphous IGZO is scalable to larger glass (e.g. Gen 10 glass) and suffer much less from variability compared to LTPS TFTs.

To produce the perception of a grayscale or full-color image using a μLED display at optimal power efficiency, it is useful to rapidly modulate the pixels of the display between on and off states such that the average of their modulated brightness waveforms corresponds to the desired 'analog' brightness for each pixel. As discussed herein, this technique is generally referred to as pulse-width modulation (PWM). Above a certain modulation frequency, the human eye and brain integrate a pixel's rapidly varying brightness (and color, in a field-sequential color display) and perceive a brightness (and color) determined by the pixel's average illumination over a video frame.

Performance of a micro-LED can impact eye fatigue. Eye fatigue is classified into two categories: nervous asthenopia and muscular asthenopia. Nervous asthenopia is fatigue caused when a user keeps seeing continuous or blinking display of a micro-LED display device for a long time so that the brightness stimulates the retina and nerve of the eye and the brain. Muscular asthenopia is fatigue caused by overuse of the ciliary muscle, which is used to adjust the focus. When a user keeps watching a micro-LED display for a long time, the retina and nerve of the eye and the brain may be stimulated, and eye fatigue might be caused as a result.

In some embodiments, a transistor using an oxide semiconductor, for example, a transistor using IGZO is used in a pixel portion of a micro LED display device. Since the off-state current of the transistor is extremely low, the luminance of the micro-LED display device can be maintained even with lower frame frequency. For example, images can be rewritten once every five seconds so that a user can see the same image as long as possible, and screen flickers perceived by the user are reduced. Thus, stimuli to the retina and nerve of the eye and the brain of the user are reduced, and nervous asthenopia is reduced accordingly.

Some embodiments provide methods, systems, and apparatus for gray scale modulation at optimal power efficiency for μLED displays. Instead of sending very short pulses (e.g., high frequency signal) from column drivers to each pixel down each column in the active matrix of μLEDs, some embodiments use ultra-compact in-pixel circuit that converts low-frequency triangular pulses sent from the column drivers into a pulse-width modulated signals to drive the μLEDs. The image data is represented by a DC voltage that is produced by a DAC.

Figure 11:
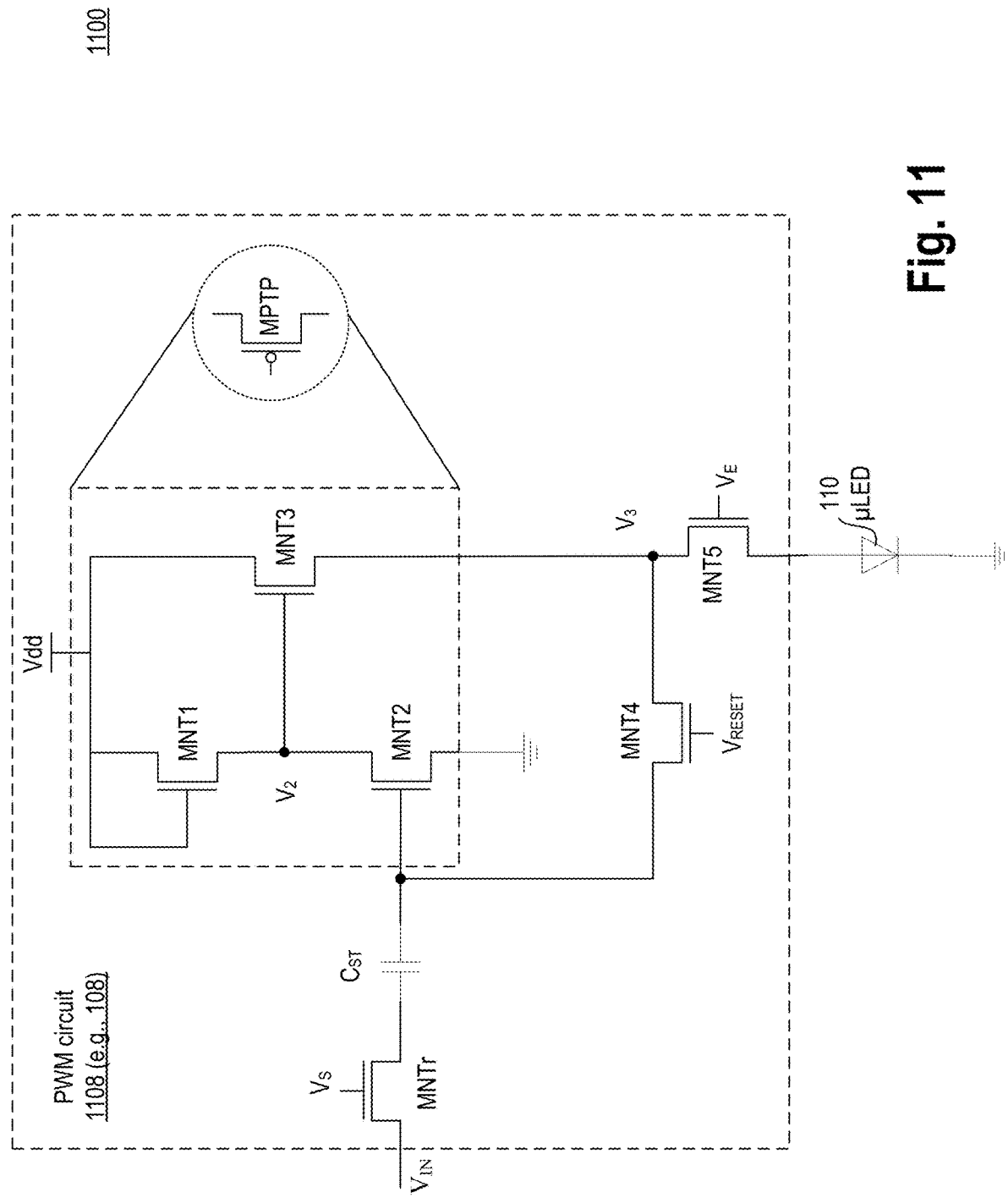
FIG. 11 illustrates an apparatus having an in-pixel driver circuit comprising IGZO TFTs to drive a μLED display, in accordance with some embodiments.

FIG. 11 illustrates apparatus 1100 comprising an in-pixel driver circuit (herein PWM circuit) comprising IGZO TFTs to drive a μLED display, in accordance with some embodiments. In some embodiments, apparatus 1100 comprises PWM circuit 1108 coupled to micro-LED 110. In some embodiments, PWM circuit 1108 comprises n-type transistors MNTr, MNT1, MNT2, MNT3, MNT4, and MNT5, and capacitive device CST coupled as shown. In some embodiments, MNTr is controlled by a scan signal (Vs) and passes data signal $V_{IN}$. In some embodiments, PWM circuit 1108 comprises at most six transistors and one capacitor. In some embodiments, the six transistors are IGZO TFTs.

In some embodiments, display 102 includes a plurality of pixels arranged in a two-dimensional matrix as shown in FIG. 1. In some embodiments, an individual pixel of the plurality of pixels includes a light-emission section 110 and drive circuit 108 to drive light-emission section 110, wherein the drive section includes an in-pixel PWM circuitry 1108 includes substantially n-type devices (or all n-type device). In various embodiments, one or more circuitries 114 and/or 116 are coupled to the plurality of pixels to provide a sawtooth or triangular pulse to drive a micro-LED coupled to the individual pixel. In some embodiments, the n-type devices (e.g., all the n-type devices MNTr, MNT1, MNT2, MNT3, MNT4, and MNT5 are IGZO devices). In some embodiments, in-pixel PWM circuitry 1108 converts the sawtooth or triangular pulse into a pulse width modulated signal to drive micro-LED 110.

In some embodiments, the in-pixel PWM circuitry comprises a first n-type device MNTr that receives an input data $V_{IN}$, wherein the first n-type device is controllable by a scan signal $V_S$; a second n-type device MNT2; and a capacitor $C_{ST}$ coupled to the first n-type device MNTr and the second n-type device MNT2. In some embodiments, in-pixel PWM circuitry 1108 comprises a third n-type device MNT4 coupled to the second n-type device MNT2 and capacitor $C_{ST}$, wherein the third n-type transistor MNT4 is controllable by a reset signal $V_{RESET}$. In some embodiments, in-pixel PWM circuitry 1108 comprises a fourth n-type device MNT5 coupled to the third n-type device MNT4 and micro-LED 110, wherein the fourth n-type transistor MNT4 is controllable by an enable signal YE. In some embodiments, in-pixel PWM circuitry 1108 comprises a fifth n-type device MNT1 coupled in series with the second transistor MNT2, wherein the gate and drain terminal of the fifth n-type transistor MNT1 is coupled to a power supply line Vdd. In some embodiments, in-pixel PWM circuitry 1108 comprises a sixth n-type device MNT3 having a gate terminal $V_2$ coupled to the second n-type device MN2 and the fifth n-type device MNT1, wherein the sixth transistor MNT3 is coupled in series with the fourth n-type transistor MNT5.

In some embodiments, micro-LED (diode) 110 is driven by a current pulse whose amplitude is fixed and duration tuned by the input voltage $V_{IN}$. $V_E$ is a pulse which is received by n-type transistor MNT5.

In some embodiments, all TFTs are n-channel and may be made with IGZO to lower cost and reduce within panel variations (e.g., avoid LTPS issues). A pseudo CMOS configuration of transistors MNT1, MNT2, and MNT3 are equivalent to a P-channel transistor MPTP as shown.

There are many technical effects of PWM circuit 1108. For example, PWM circuit 1108 consumes a small area and can fit in high resolution displays (e.g. 13.3" laptop with resolution of QHD or 4K resolutions. PWM circuit 1108 has high power efficiency since micro-LEDs 110 are operated at peak external quantum efficiency point as shown in FIG. 3. Micro-LED display device or apparatus 1100 of one embodiment of the present disclosure has a small-size pixel and thus can display high-resolution images, so that a precise and smooth image can be displayed.

Figure 12:
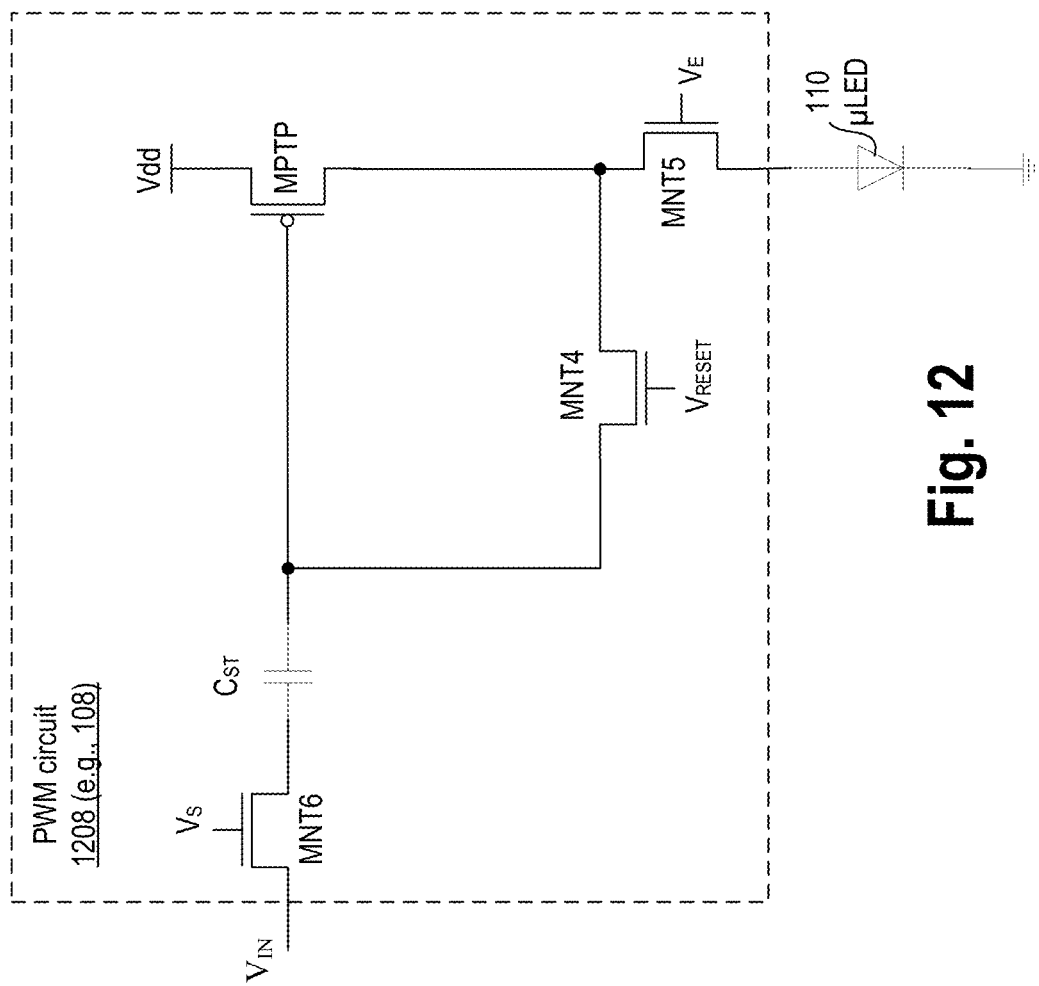
FIG. 12 illustrates an equivalent circuit of FIG. 11, in accordance with some embodiments.

FIG. 12 illustrates equivalent circuit 1200 of FIG. 11, in accordance with some embodiments. Equivalent circuit 1200 is used to explain the operation of PWM circuit 1208 (equivalent of 1108). During the "write period" being the first half of one image frame, the gate drive circuit sequentially scans the pixels by each row. Synchronously, the signal drive circuit writes an analog signal voltage into the signal lines as signal data $V_{IN}$. In some embodiments, in the pixel on the n-th row selected by the gate drive circuit, the light-on TFT switch MNT5 is turned ON first, and then the reset TFT switch MNT4 is turned ON by asserting $V_{RESET}$. As both the switches are turned ON, the micro-LED drive TFT MPTP (which is an equivalent model of MNT1, MNT2, and MNT3) is put into a diode connection with the same potential applied across the gate and the drain of MPTP.

Accordingly, applying a specific voltage to the power supply line Vdd in advance will put the micro-LED drive TFT MNTP and micro-LED 110 into the conductive state. Next, as the light-on TFT MNT5 switch is turned OFF, micro-LED drive TFT MPTP and micro-LED 110 are forcibly put into the OFF state because gate of MPTP rises to Vdd. At this moment, since the gate and the drain of the micro LED drive TFT MPTP are short-circuited through the reset TFT switch MNT4, the gate voltage of the micro-LED drive TFT MPTP is automatically reset to a voltage lower by the threshold voltage Vth than the voltage of the power supply line (e.g., Vg~VDD−Vth).

At this moment, the analog signal voltage is inputted as the signal line data $V_{IN}$ to the other end of the pixel capacitor $C_{ST}$. Next, as the reset TFT switch MNT4 is turned OFF by de-asserting $V_{RESET}$, the potential difference between both ends of the pixel capacitor $C_{ST}$ is stored to remain intact in the pixel capacitor $C_{ST}$. In other words, when a voltage equal to the analog signal voltage is inputted to one end of the pixel capacitor $C_{ST}$ on the side of the signal line $V_{IN}$, the gate voltage of the micro-LED drive TFT MPTP is forcibly set to a voltage lower by the threshold voltage Vth than a voltage of the power supply line.

At this time, if a voltage level inputted to one end of the pixel capacitor $C_{ST}$ on the side of the signal line is higher than the analog signal voltage, the micro-LED drive TFT MPTP is OFF, and if the voltage level is lower than the analog signal voltage, the micro-LED drive TFT MPTP is ON. However, during the period of scanning the pixels of the other rows, the light-on TFT MNT5 switch of the concerned pixel is always OFF. Accordingly, the micro-LED will not light up regardless of the high or low of the data voltage on the signal line. In this manner, the writing of the analog signal voltage into the pixels is carried out sequentially by each row, and the "write period" in the first half of one frame ends at the time when the writing into all the pixels is completed.

Figure 13:
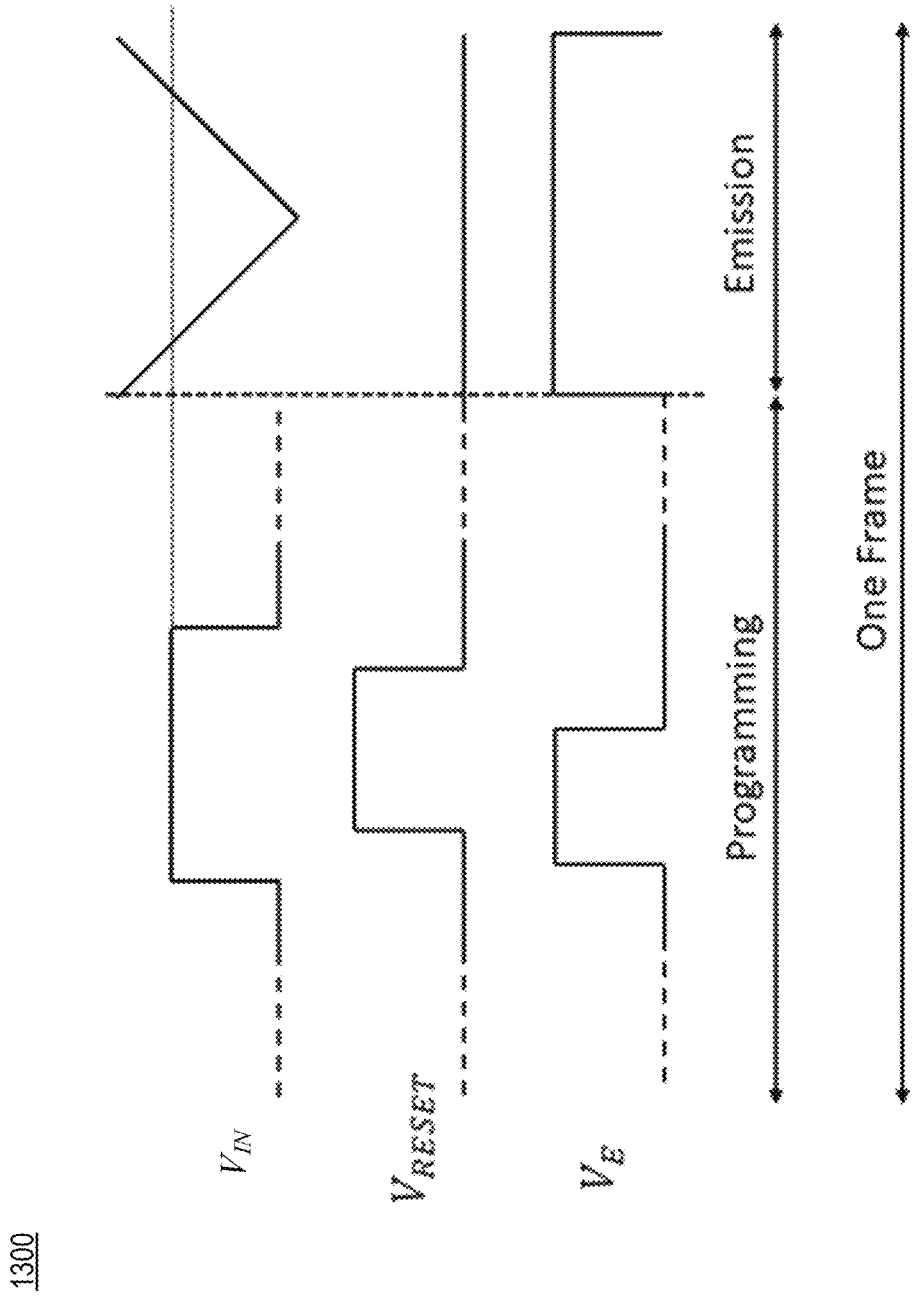
FIG. 13 illustrates a timing diagram for the in-pixel driver circuit of FIG. 11, in accordance with some embodiments.
Figure 14:
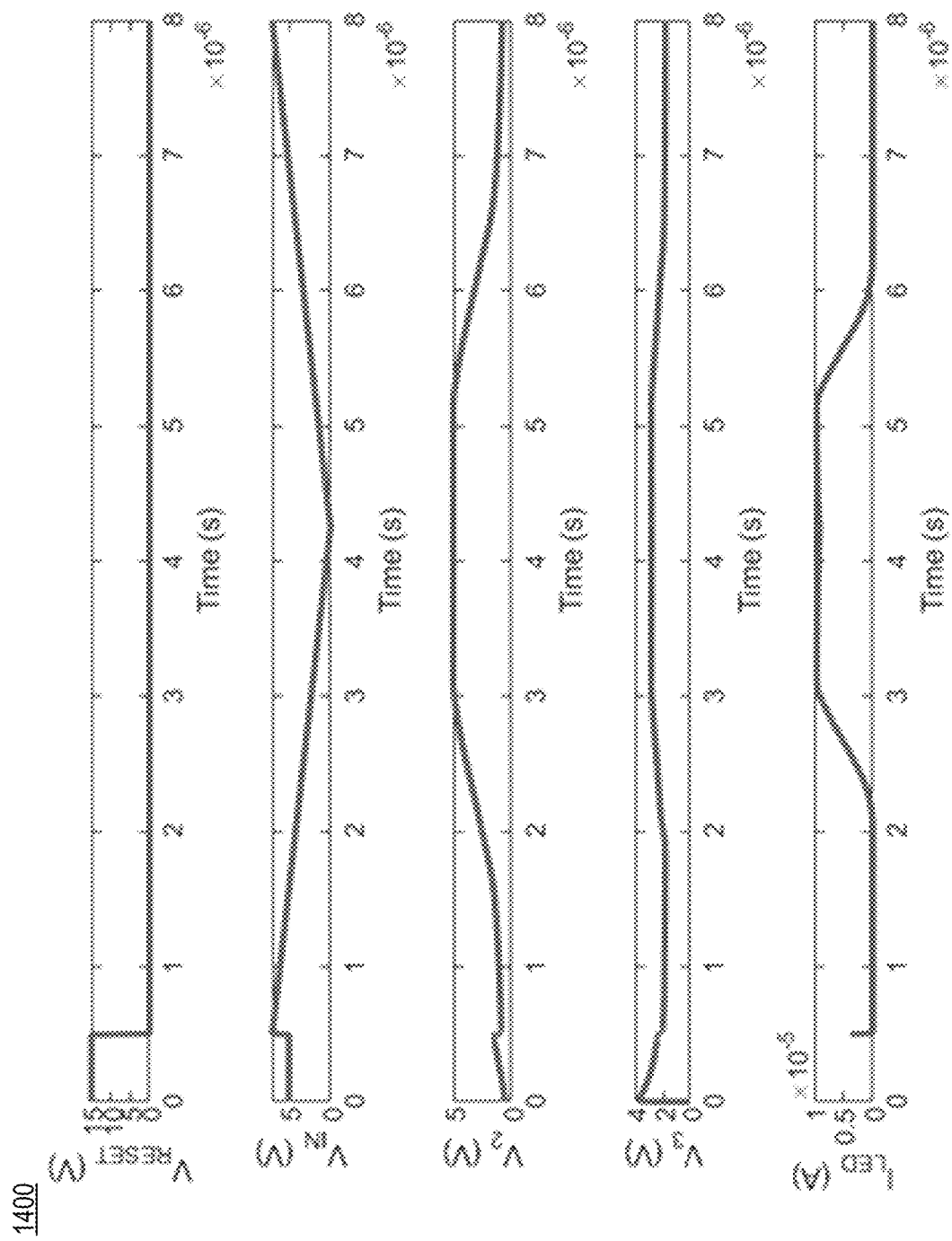
FIG. 14 illustrates a set of plots showing simulation of FIG. 11, in accordance with some embodiments.

Next, during the "light-on period" being the latter half of one image frame, the light-on control line ($V_E$) turns ON simultaneously the light-on TFT switches MNT5 of all the pixels. At this moment, the triangular pulse input line inputs the triangular pulse as the signal line data into the signal lines as illustrated by FIGS. 13-14. Referring back to FIG. 12, as mentioned herein, each pixel capacitor $C_{ST}$ is reset such that the micro-LED drive TFT MPTP is turned ON or OFF according to whether the voltage of the signal line is higher or lower than the analog signal voltage written in advance. Since the light-on TFT switch MNT5 is always ON in the "light-on period," micro-LED 110 of each pixel is driven by the micro-LED drive TFT MPTP according to the relation between the analog signal voltage written in advance and the triangular pulse voltage applied to the signal line.

Now, if the mutual conductance (gm) (the current drive capability) of the micro-LED drive TFT is sufficiently high (i.e., high W/L ratio or high mobility), micro-LED 110 can be regarded as being driven ON/OFF digitally. That is, micro LED 110 continues to light up with a virtually constant intensity only for the period that is dependent on the analog signal voltage written in advance. The modulation of this light emission period is visually recognized as a multi-gradation light emission. This recognition is not basically changed by any influences, even if the characteristic of the micro LED drive TFT is uneven.

In some embodiments, it is useful to make the amplitude of the triangular pulse substantially coincident with the amplitude of the analog signal voltage $V_{IN}$. In regard to the waveform of the triangular pulse, various changes are possible within the gist of the invention. Some embodiments take on the triangular waveform of bilateral symmetry such that the center of the emitting period does not depend upon the gradation of light emission. However, it is possible to use an asymmetrical triangular waveform, a non-linear triangular waveform equivalent to the gamma characteristic modulation, or plural triangular waveforms, etc. to attain different visual characteristics. In various embodiments, the turning on of all the pixels simultaneously reduces flicker and eye strain.

FIG. 13 illustrates timing diagram 1300 for the in-pixel driver circuit of FIG. 11, in accordance with some embodiments. Timing diagram 1300 shows a programming phase and emission phase in one image frame. The programming phase starts by the enable pulse $V_E$. Note, the value of $V_{IN}$ is held high longer (compared to $V_{RESET}$) because of capacitor $C_{ST}$. In the emission phase when micro-LED 110 emits light, $V_E$ is held high while $V_{IN}$ line is supplied with the triangular wave.

FIG. 14 illustrates a set of plots 1400 showing simulation of FIG. 11, in accordance with some embodiments. The simulation shows that a current pulse $I_{LED}$ is produced to flow into the micro LEDs in response to the signals applied to $V_{IN}$, $V_E$, and $V_{RESET}$. Signals on internal nodes $V_2$ and $V_3$ are also provided.

The following section describes a mixed signal driver circuit for LED displays using IGZO TFTs. In some embodiments, the mixed signal driver is part in-pixel, and part outside of the pixel. In some embodiments, the mixed signal driver is outside of the pixel. It is challenging to accurately control the brightness and color of inorganic light-emitting diode pixels. At low gray levels, for example, the efficiency of the inorganic light-emitting diodes is dependent on drive current. The variation in the efficiency of the inorganic light-emitting diodes and the differing responses of emissive inorganic materials in diodes of different colors may make it difficult to calibrate the brightness and color of the display accurately. The mixed signal driver of some embodiments provides displays such as inorganic light-emitting diode displays that exhibit enhanced performance. Existing analog circuit for a pixel driver usually results in inaccurate and nonuniform color rendering, especially at low gray levels.

Some embodiments describe pixel driving circuits based on N-channel IGZO TFTs that provide the bulwark against threshold voltage shift in micro-LED displays. This enables the use of TFT backplanes that are cheaper compared to LTPS TFT backplanes, for example. In some embodiments, the pixel driving circuits enable mixed signal driving of μLEDs to operate μLEDs at maximum power efficiency and uniform and accurate color rendering at low gray levels. In some embodiments, the pixel driving circuit is based on current programming. As such, the pixel driving circuit of some embodiments is referred to as current programming circuit. In some embodiments, the current programming circuit provides benefit in terms of uniform luminance across large displays (e.g. 13.3"-17.5" diagonal displays). The pixel driving circuits of some embodiments provide accurate color rendering at low gray scale levels, low manufacturing cost, and low power consumption, especially at higher brightness levels. Other technical effects will be evident by the various figures and embodiments.

In some embodiments, an apparatus is provided which comprises a plurality of pixels arranged in a two-dimensional matrix, wherein an individual pixel of the plurality of pixels each includes a light-emission section. In some embodiments, the apparatus comprises a drive circuit to drive the light-emission section, wherein the drive circuit applies pulse amplitude modulation with fixed pulse width to control brightness of the light-emission section. In some embodiments, the drive circuit causes an average current to flow through the light-emission section, wherein the average current comprises data current from pulse amplitude modulation with fixed pulse width and data current from pulse width modulation with fixed amplitude.

In some embodiments, the drive circuit comprises: a first n-type transistor controllable by a first select line; a second n-type transistor coupled in series with the first n-type transistor, wherein the second n-type transistor is coupled to the light-emission section; and a third n-type transistor coupled to a drain of the first n-type transistor, wherein a gate of the third n-type transistor is controllable by a second select line. In some embodiments, the drive circuit comprises a fourth transistor coupled to a gate of the second n-type transistor, wherein a gate of the fourth n-type transistor is controllable by the second select line, and wherein the third n-type transistor and the fourth n-type transistor is coupled to a data line. In some embodiments, the data line is to provide data current associated with an image.

In some embodiments, the drive circuit comprises a first capacitor coupled to the second select line and the gate of the second n-type transistor, the gate of the third n-type transistor, and the gate of the fourth n-type transistor. In some embodiments, the drive circuit comprises a second capacitor coupled to the first capacitor and the gate of the second n-type transistor. In some embodiments, where during an on-state, the second select line is to turn on the third n-type transistor and the fourth n-type transistor, and data current passes through the third n-type transistor and the fourth n-type transistor to the light-emission section, wherein during the on-state, the first select line is to turn off the first n-type transistor. In some embodiments, the drive circuit is controllable by two select signals that adjust current through the light-emission section. In some embodiments, the light-emission section comprises two LEDs coupled in parallel. In some embodiments, the drive circuit comprises at most four n-type transistors. In some embodiments, the four n-type transistors are IGZO TFTs.

Figure 15:
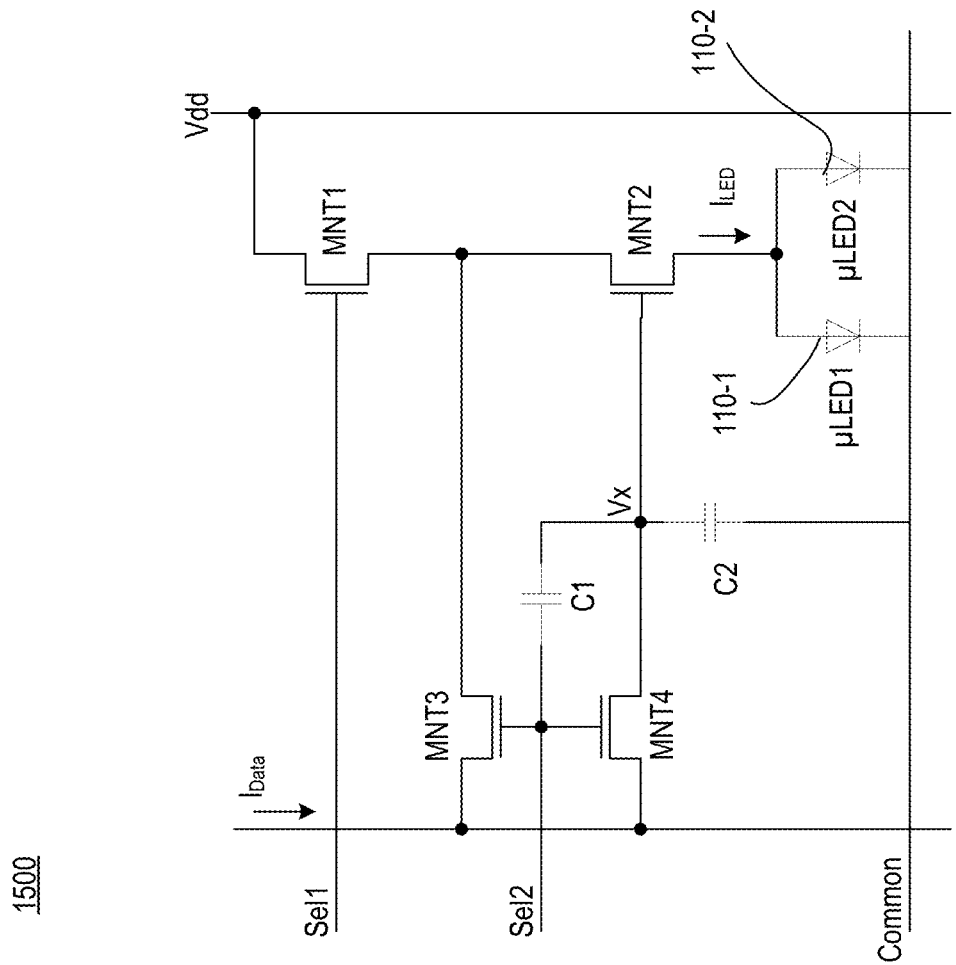
FIG. 15 illustrates a current-programmed pixel driver, in accordance with some embodiments.
Figure 15:
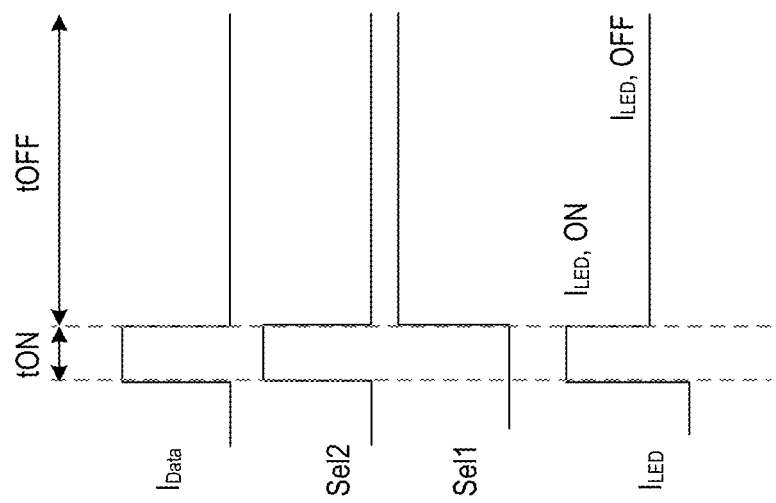

FIG. 15 illustrates current-programmed pixel driver 1500, in accordance with some embodiments. In some embodiments, current-programmed pixel driver 1500 comprises n-type transistors MNT1, MNT2, MNT3, and MNT4, capacitors C1 and C2 (e.g., 1 fF to 100 fF), diodes 110-1 and 110-2, power supply line Vdd, first scan line Sel1, second scan line Sel2, and common line (or ground), coupled as shown. In some embodiments, the n-type transistors are TFT transistors. In some embodiments, transistors MNT1, MNT3, and MNT4 are switching transistors while transistor MNT2 is a driving transistor. In some embodiments, capacitors C1 and C2 are storage capacitors connected between a scan line (SEL2) and ground. In some embodiments, μLED-ON and μLED-OFF are described as the current flowing through μLED 110-1 and 110-2 during the ON- and OFF-state, respectively. During the ON-state, Sel2 turns MNT3 and MNT4 ON, and $I_{DATA}$ (=μLED-ON) passes through MNT3 and MNT2 to the μLEDs 110-1 and 110-2 while the MNT1 remains turned-off by Sel1 signal line.

When the Sel2 changes from the ON- to OFF-state, Sel2 turns MNT3 and MNT4 OFF, and Sel1 simultaneously turns MNT1 ON. Since gate bias of MNT2 (Vx_ON) is reduced to Vx_OFF by the ratio of capacitors (Vx_OFF=Vx_ON− ΔVSel2 C1/(C1+C2)), a scaled-down data current (ILED_OFF) flows through the μLEDs 110-1 and 110-2. This OFF-state current is lower for IGZO TFT than for LTPS TFTs allowing for better digital driving of the micro LEDs. In some embodiments, TFTs can be made of any other oxide semiconductor material. In some embodiments, circuits in row driver 116 generate Sel1 and Sel2 signals.

The following equations describe the operation of the circuit shown in FIG. 15.

$$I_{DATA} = \frac{1}{2}\frac{W}{L}C_{ox}\mu(V_{x,ON} - V_{LED} - V_T)^2 \quad (1)$$

$$V_{x,ON} = V_T + V_{LED} + \sqrt{\frac{2I_{DATA}}{\mu C_{ox}(W/L)}} \quad (2)$$

$$V_{x,OFF} = \quad (3)$$

$$V_{x,ON} - V_{DD}\frac{C_1}{C_1 + C_2} = V_T + V_{LED} + \sqrt{\frac{2I_{DATA}}{\mu C_{ox}(W/L)}} - V_{DD}\frac{C_1}{C_1 + C_2}$$

$$I_{ON} = I_{DATA} \quad (4)$$

$$I_{OFF} = \quad (4)$$

$$\frac{1}{2}\frac{W}{L}C_{ox}\mu\left(V_T + V_{LED} + \sqrt{\frac{2I_{DATA}}{\mu C_{ox}(W/L)}} - V_{DD}\frac{C_1}{C_1 + C_2} - V_{LED} - V_T\right)^2$$

$$I_{OFF} = \frac{1}{2}C_{ox}\mu\left(\sqrt{\frac{2I_{DATA}}{\mu C_{ox}(W/L)}} - V_{DD}\frac{C_1}{C_1 + C_2}\right)^2 \quad (5)$$

The average current through the μLEDs over one scan period is given by:

$$I_{LED} = \frac{I_{OFF}t_{OFF} + I_{DATA}t_{ON}}{t_{OFF} + t_{ON}} \quad (6)$$

In some embodiments, $I_{DATA}$ is much larger than the LED current and that solves the problem of settling time typically associated with current programming circuits. In some embodiments, the average LED current can be controlled by fixing the data current amplitude and varying the pulse ON time ($t_{ON}$), as shown in Equation (6).

For high resolution control, the current $I_{OFF}$ is close to zero. In some embodiments, this may be accomplished by setting the data current amplitude at a value given by (according to equation (5)):

$$I_{DATA} \leq \frac{1}{2}C_{ox}\mu(W/L)\left(V_{DD}\frac{C_1}{C_1 + C_2}\right)^2 \quad (7)$$

In some embodiments, equation (7) can be satisfied by using large enough Vdd, large enough W/L size for transistor MNT2, and by using IGZO RFTs with small off-state current. In some embodiments, circuit 1500 is used for OLED displays.

According to equation (5) that describes the operation of circuit 1500, it is possible to use analog driving for low gray levels where short pulsed may not be possible for large displays due to the time constant of the interconnect lines. In this case, the amplitude of current $I_{DATA}$ is used to dial in the gray level instead of using short pulses. For high gray levels, the on-time $t_{ON}$ in Equation (6) can be controlled to control gray scale, while the current pulse is adjusted at the maximum efficiency point for the micro-LEDs. Some embodiments realize higher-precision and higher-gradation display which is not easily achieved by a single "digital circuit" or "analog circuit", by allowing both an "analog signal" and a "digital signal" to coexist in a single circuit in consideration of a special boundary condition of a display such that a human visual characteristic sense a similar gray scale in each of digital display and analog display.

Figure 16:
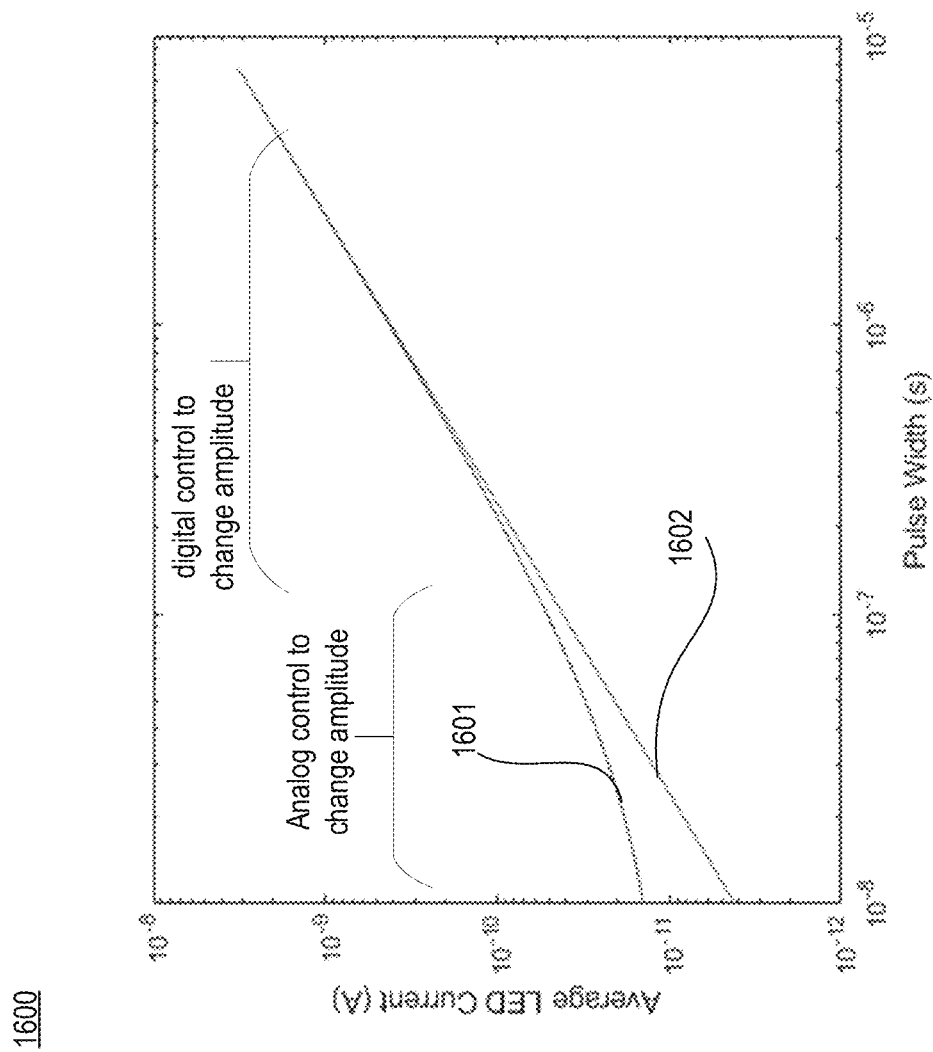
FIG. 16 illustrates a plot showing average LED current as a function of current pulse width for the current-programmed pixel driver, in accordance with some embodiments.

FIG. 16 illustrates plot 1600 showing average LED current as a function of current pulse width for the current-programmed pixel driver, in accordance with some embodiments. The average LED current as a function of current pulse width ($t_{ON}$) demonstrates a wide range of control of the LED luminance using the width of the current pulse for LTPS TFTs (1601) and IGZO TFTs (1602). In this example, C1=100 fF, C2=10 fF, VDD=5 V, mobility=50 cm²/V-s for LTPS 10 cm²/V-s for IGZO, and tox=200 nm, W/L=10, $I_{DATA}$=6 μA. In some embodiments, circuit 1500 provides better performance with transistors are IGZO TFTs than for LTPS TFTs due to lower leakage in the case of IGZO TFTs.

Figure 17:
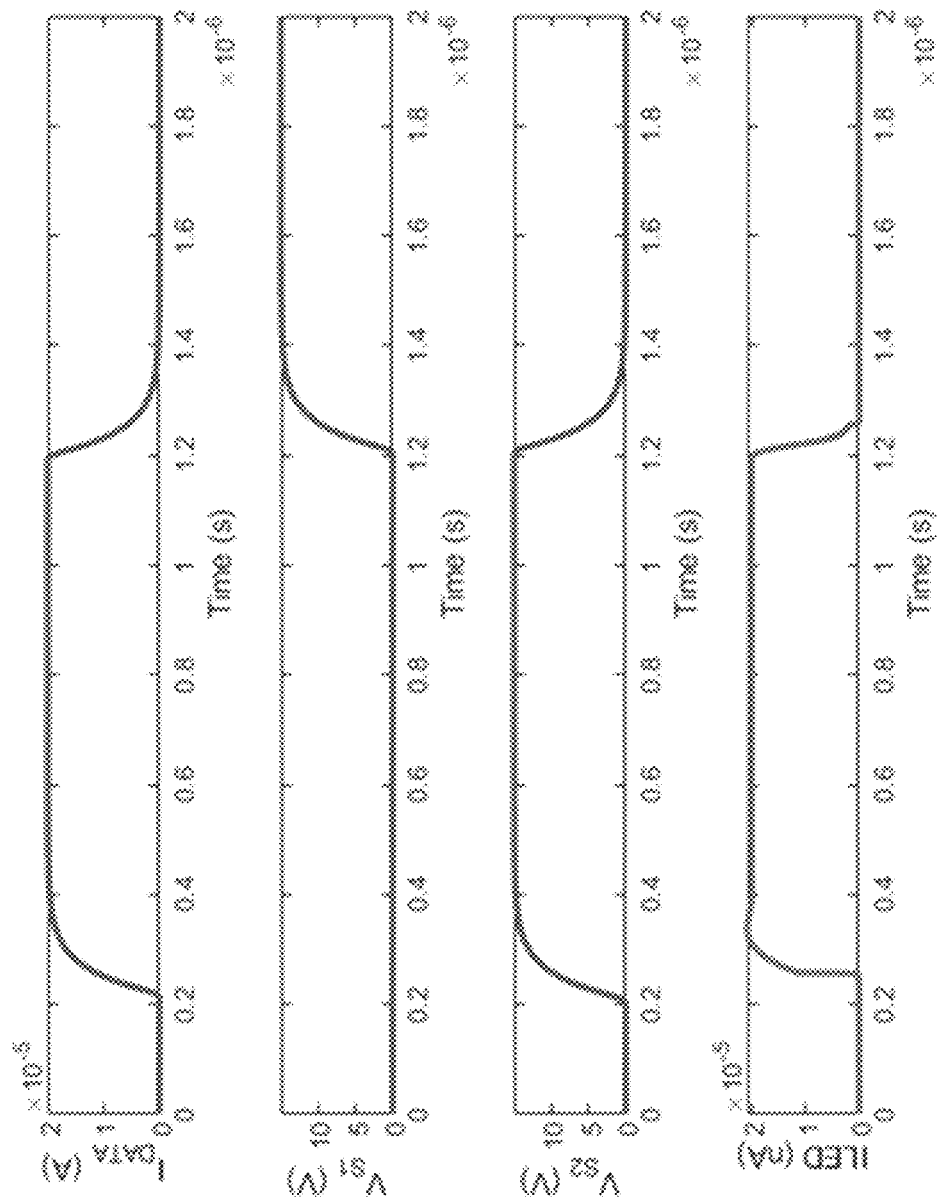
FIG. 17 illustrates a set of plots showing operation of the current-programmed pixel driver, in accordance with some embodiments.

FIG. 17 illustrates a set of plots 1700 showing operation of the current-programmed pixel driver, in accordance with some embodiments. In this example, the transistors of circuit 1500 have W=L=2.5 μm, C1=10 fF and C2=1 fF, the supply voltage is 5V, and the current pulse is 20 μA. Here, the magnitude of the output current pulse is the same as the input current pulse. Also, the off-state current is much, much smaller than the ON-state current (current pulse magnitude).

Figure 18:
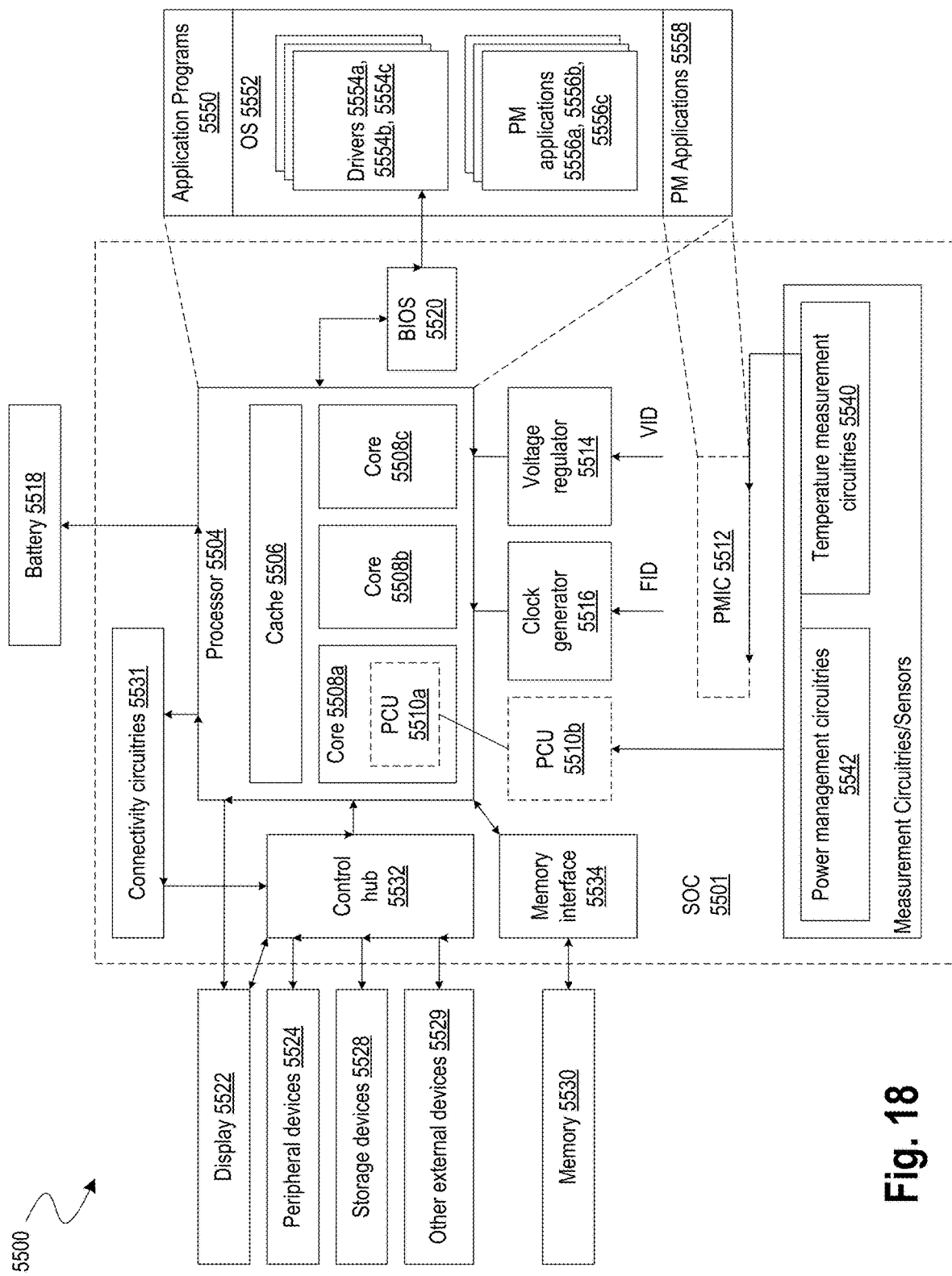
FIG. 18 illustrates a smart device or a computer system or a SoC (System-on-Chip) having or coupled to a micro-LED display having the pixel driver, in accordance with some embodiments.

FIG. 18 illustrates a smart device or a computer system or a SoC (System-on-Chip) having or coupled to a micro-LED display having the pixel driver, in accordance with some embodiments. It is pointed out that those elements of FIG. 18 having the same reference numbers (or names) as the elements of any other figure may operate or function in any manner similar to that described, but are not limited to such. Any block in this smart device can have the apparatus for dynamically optimizing battery charging voltage.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 18, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing implementations such as disaggregated combinations of multiple compute, graphics, accelerator, I/O and/or other processing chips. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508*a*, 5508*b*, 5508*c*. Although merely three cores 5508*a*, 5508*b*, 5508*c* are illustrated in FIG. 18, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508a, 5508b, 5508c, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC

5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510*a/b* and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510*a*. In an example, some other sections of PCU 5510 may be implemented outside the processing cores 5508, and these sections of PCU 5510 are symbolically illustrated using a dotted box and labelled as PCU 5510*b*. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556*a*, 5556*b*, 5556*c*. The OS 5552 may also include various drivers 5554*a*, 5554*b*, 5554*c*, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, battery 5518 includes hybrid technologies. For example, a mix of high energy density charge (e.g., Li-Ion batteries) carrying device(s) and low energy density charge carrying devices (e.g., supercapacitor) are used as batteries or storage devices. In some embodiments, a controller (e.g., hardware, software, or a combination of them) is used analyze peak power patterns and minimizes the impact to overall lifespan of high energy density charge carrying device-based battery cells while maximizing service time for peak power shaving feature. The controller may be part of battery 5518 or part of p-unit 5510*b*.

In some embodiments, pCode executing on PCU 5510*a/b* has a capability to enable extra compute and telemetries resources for the runtime support of the pCode. Here pCode refers to a firmware executed by PCU 5510*a/b* to manage performance of the SoC 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Some embodiments use three components to adjust the peak power of SoC 5501 based on the states of a USB TYPE-C device 5529. These components include OS Peak Power Manager (part of OS 5552), USB TYPE-C Connector Manager (part of OS 5552), and USB TYPE-C Protocol Device Driver (e.g., one of drivers 5554*a*, 5554*b*, 5554*c*). In some embodiments, the USB TYPE-C Connector Manager sends a synchronous request to the OS Peak Power Manager when a USB TYPE-C power sink device is attached or detached from SoC 5501, and the USB TYPE-C Protocol Device Driver sends a synchronous request to the Peak Power Manager when the power sink transitions device state. In some embodiments, the Peak Power Manager takes power budget from the CPU when the USB TYPE-C connector is attached to a power sink and is active (e.g., high power device state). In some embodiments, the Peak Power Manager gives back the power budget to the CPU for performance when the USB TYPE-C connector is either detached or the attached and power sink device is idle (lowest device state).

In some embodiments, logic is provided to dynamically pick the best operating processing core for BIOS power-up flows and sleep exit flows (e.g., S3, S4, and/or S5). The selection of the bootstrap processor (BSP) is moved to an early power-up time instead of a fixed hardware selection at any time. For maximum boot performance, the logic selects the fastest capable core as the BSP at an early power-up time. In addition, for maximum power saving, the logic selects the most power efficient core as the BSP. Processor or switching for selecting the BSP happens during the boot-up as well as power-up flows (e.g., S3, S4, and/or S5 flows).

In some embodiments, the memories herein are organized in multi-level memory architecture and their performance is governed by a decentralized scheme. The decentralized scheme includes p-unit 5510 and memory controllers. In some embodiments, the scheme dynamically balances a number of parameters such as power, thermals, cost, latency and performance for memory levels that are progressively further away from the processor in platform 5500 based on how applications are using memory levels that are further away from processor cores. In some examples, the decision making for the state of the far memory (FM) is decentralized. For example, a processor power management unit (p-unit), near memory controller (NMC), and/or far memory host controller (FMHC) makes decisions about the power and/or performance state of the FM at their respective levels. These decisions are coordinated to provide the most optimum power and/or performance state of the FM for a given time. The power and/or performance state of the memories adaptively change to changing workloads and other parameters even when the processor(s) is in a particular power state.

In some embodiments, a hardware and software coordinated processor power state policy (e.g., policy for C-state) is implemented that delivers optimal power state selection by taking in to account the performance and/or responsiveness needs of thread expected to be scheduled on the core entering idle, to achieve improved instructions per cycle (IPC) and performance for cores running user critical tasks. The scheme provides the ability to deliver responsiveness gains for important and/or user-critical threads running on a system-on-chip. P-unit 5510 which coupled to the plurality of processing cores, receives a hint from operating system 5552 indicative of a bias towards a power state or performance state for at least one of the processing cores of the plurality of processing cores based on a priority of a thread in context switch.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies. Each processor may also be a dielet or chiplet.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here, the term "interconnect" refers to a communication link, or channel, between two or more points or nodes. It may comprise one or more separate conduction paths such as wires, vias, waveguides, passive components, and/or active components. It may also comprise a fabric. In some embodiments, a p-unit is coupled to an OS via an interface.

Here the term "interface" generally refers to software and/or hardware used to communicate with an interconnect. An interface may include logic and I/O driver/receiver to send and receive data over the interconnect or one or more wires.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a plurality of pixels arranged in a two-dimensional matrix, wherein an individual pixel of the plurality of pixels each includes a light-emission section and a drive circuit to drive the light-emission section, wherein the drive section includes an in-pixel PWM circuitry to receive a sawtooth or triangular pulse and an electric potential based on an image signal voltage, and to output a current pulse based on a comparison of the sawtooth or triangular pulse and the electric potential, wherein the in-pixel PWM circuitry includes at most 7 transistors; and one or more circuitries coupled to the plurality of pixels to provide the sawtooth or triangular pulse and the electric potential.

Example 2: The apparatus of example 1, wherein the in-pixel PWM circuitry comprises: a first n-type transistor to receive the electric potential based on the image signal voltage, and controllable by a scan node; and a second n-type transistor having a gate terminal couples to a source or drain of the first n-type transistor, wherein a source terminal of the second n-type transistor is to receive the sawtooth or triangular pulse.

Example 3: The apparatus of example 2, wherein the in-pixel PWM circuitry comprises a p-type transistor coupled in series with the second n-type transistor, wherein a gate of the p-type transistor is controllable by a bias voltage.

Example 4: The apparatus of example 3, wherein the second n-type transistor and the p-type transistor is coupled to one or more micro-LEDs.

Example 5: The apparatus of example 1, wherein the pixels are arranged in a two-dimensional matrix in a first direction and a second direction.

Example 6: The apparatus of example 1, wherein the light-emission section includes a micron-size light emitting diode.

Example 7: The apparatus of example 1, wherein the PWM circuitry includes thin film transistors on a display backplane.

Example 8: The apparatus of example 1, wherein the PMW circuitry includes low temperature polysilicon thin film transistors.

Example 9: The apparatus of example 1, wherein the PWM circuitry includes n-channel transistors and p-channel transistors.

Example 10: The apparatus of example 9, wherein the n-channel or p-channel transistors includes one of: low temperature polysilicon, InP, GaP, GaN, or IGZO thin film transistors.

Example 11: The apparatus of example 1, wherein the plurality of pixels has an area that is below approximately 30 µm×30 µm.

Example 12: A system comprising: a processor; a memory coupled to the processor; a display to project an image generated by the processor, wherein the display comprises: a plurality of pixels arranged in a two-dimensional matrix, wherein an individual pixel of the plurality of pixels each includes a light-emission section and a drive circuit to drive the light-emission section, wherein the drive section includes an in-pixel PWM circuitry to receive a sawtooth or triangular pulse and an electric potential based on an image signal voltage, and to output a current pulse based on a comparison of the sawtooth or triangular pulse and the electric potential, wherein the in-pixel PWM circuitry includes at most 7 transistors; and one or more circuitries coupled to the plurality of pixels to provide the sawtooth or triangular pulse and the electric potential.

Example 13: The system of example 12, wherein the in-pixel PWM circuitry comprises: a first n-type transistor to receive the electric potential based on the image signal voltage, and controllable by a scan node; a second n-type transistor having a gate terminal couples to a source or drain of the first n-type transistor, wherein a source terminal of the second n-type transistor is to receive the sawtooth or triangular pulse; and a p-type transistor coupled in series with the second n-type transistor, wherein a gate of the p-type transistor is controllable by a bias voltage, wherein the second n-type transistor and the p-type transistor is coupled to one or more micro-LEDs.

Example 14: The system of example 12, wherein the pixels are arranged in a two-dimensional matrix in a first direction and a second direction.

Example 15: The system of example 12, wherein the light-emission section includes a micron-size light emitting diode.

Example 16: The system of example 12, wherein the PWM circuitry includes thin film transistors on a display backplane, or low temperature polysilicon thin film transistors.

Example 17: The system of example 12, wherein the PWM circuitry includes transistors that are one of: low temperature polysilicon, InP, GaP, GaN, or IGZO thin film transistors.

Example 18: The system of example 12, wherein the plurality of pixels has an area that is below approximately 30 µm×30 µm.

Example 19: An apparatus comprising: a plurality of pixels arranged in a two-dimensional matrix, wherein an individual pixel of the plurality of pixels each includes a light-emission section and a drive circuit to drive the light-emission section, wherein the drive section includes an in-pixel PWM circuitry which includes substantially n-type devices; and one or more circuitries coupled to the plurality of pixels to provide a sawtooth or triangular pulse to drive a micro-LED coupled to the individual pixel.

Example 20: The apparatus of example 19, wherein the n-type devices are IGZO devices.

Example 21: The apparatus of example 19, wherein the in-pixel PWM circuitry converts the sawtooth or triangular pulse into a pulse width modulated signal to drive the micro-LED.

Example 22: The apparatus of example 19, wherein the in-pixel PWM circuitry comprises: a first n-type device that receives an input data, wherein the first n-type device is controllable by a scan signal; a second n-type device; and a capacitor coupled to the first n-type device and the second n-type device.

Example 23: The apparatus of example 22, wherein the in-pixel PWM circuitry comprises: a third n-type device coupled to the second n-type device and the capacitor, wherein the third n-type device is controllable by a reset signal; and a fourth n-type device coupled to the third n-type device and the micro-LED, wherein the fourth n-type device is controllable by an enable signal.

Example 24: The apparatus of example 23, wherein the in-pixel PWM circuitry comprises: a fifth n-type device coupled in series with the second n-type device, wherein the gate and drain terminal of the fifth n-type device is coupled to a power supply line; and a sixth n-type transistor having a gate terminal coupled to the second n-type device and the fifth n-type device, wherein the sixth n-type device is coupled in series with the fourth n-type device.

Example 25: An apparatus comprising: a plurality of pixels arranged in a two-dimensional matrix, wherein an individual pixel of the plurality of pixels each includes a light-emission section; and a drive circuit to drive the light-emission section, wherein the drive circuit is to apply pulse amplitude modulation with fixed pulse width to control brightness of the light-emission section.

Example 26: The apparatus of example 25, wherein the drive circuit is to cause an average current to flow through the light-emission section, wherein the average current comprises data current from pulse amplitude modulation with fixed pulse width and data current from pulse width modulation with fixed amplitude.

Example 27: The apparatus of example 25, wherein the drive circuit comprises: a first n-type transistor controllable by a first select line; a second n-type transistor coupled in series with the first n-type transistor, wherein the second n-type transistor is coupled to the light-emission section; and a third n-type transistor coupled to a drain of the first n-type transistor, wherein a gate of the third n-type transistor is controllable by a second select line.

Example 28: The apparatus of example 27, wherein the drive circuit comprises a fourth transistor coupled to a gate of the second n-type transistor, wherein a gate of the fourth n-type transistor is controllable by the second select line, wherein the third n-type transistor and the fourth n-type transistor is coupled to a data line.

Example 29: The apparatus of example 25, wherein the data line is to provide data current associated with an image.

Example 30: The apparatus of example 28, wherein the drive circuit comprises: a first capacitor coupled to the second select line and the gate of the second n-type transistor, the gate of the third n-type transistor, and the gate of the fourth n-type transistor; and a second capacitor coupled to the first capacitor and the gate of the second n-type transistor.

Example 31: The apparatus of example 30, where during an on-state, the second select line is to turn on the third n-type transistor and the fourth n-type transistor, and data current passes through the third n-type transistor and the fourth n-type transistor to the light-emission section, wherein during the on-state, the first select line is to turn off the first n-type transistor.

Example 32: The apparatus of example 25, wherein the drive circuit is controllable by two select signals that adjust current through the light-emission section.

Example 33: The apparatus of example 25, wherein the light-emission section comprises two LEDs coupled in parallel.

Example 34: The apparatus of example 25, wherein the drive circuit comprises at most four n-type transistors.

Example 35: The apparatus of example 34, wherein the four n-type transistors are IGZO TFTs.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
   a plurality of pixels arranged in a two-dimensional matrix, wherein an individual pixel of the plurality of pixels includes a light-emission section and a drive circuit, wherein the drive circuit includes an in-pixel pulse-width modulation (PWM) circuitry comprising:
   a first n-type transistor to receive a data voltage, wherein the first n-type transistor is controllable by a scan signal;
   a second n-type transistor having a gate terminal coupled to a source or drain terminal of the first n-type transistor, wherein a source terminal of the second n-type transistor is to receive a sawtooth or triangular pulse; and
   a p-type transistor coupled in series with the second n-type transistor, wherein:
      a gate terminal of the p-type transistor is controllable by a bias voltage;
      a drain terminal of the p-type transistor is coupled to a drain terminal of the second n-type transistor;
      an output node is between, and in series with, the second n-type transistor and the p-type transistor; and
      the output node is coupled to the light-emission section and is to carry a current pulse for the light-emission section having a pulse width determined by a difference between the sawtooth or triangular pulse and the data voltage.

2. The apparatus of claim 1, wherein the light-emission section comprises one or more micro light-emitting diodes having a size of less than 30 µm×30 µmm.

3. The apparatus of claim 1, wherein the PWM circuitry includes thin film transistors on a display backplane.

4. The apparatus of claim 1, wherein the drive circuit is a three-transistor circuit.

5. The apparatus of claim 1, wherein the n-type transistors comprise at least one of: low temperature polysilicon, InP, GaP, GaN, or indium gallium zinc oxide.

6. A system, comprising:
   a processor;
   a memory coupled to the processor;
   a display to project an image generated by the processor, wherein the display comprises a plurality of pixels arranged in a two-dimensional matrix, an individual pixel of the plurality of pixels includes a light-emission section and a drive circuit, the drive circuit includes an in-pixel pulse-width modulation (PWM) circuitry comprising:
   a first n-type transistor to receive input data, wherein a gate terminal of the first n-type transistor is to receive a scan signal;
   a second n-type transistor having a gate terminal coupled to the first n-type;
   a first p-type transistor in a current mirror, wherein the first p-type transistor is in series with the second n-type transistor;
   a second p-type transistor in the current mirror, wherein the second p-type transistor is in series with a third n-type transistor;
   wherein a gate terminal of the third n-type transistor is to receive a sawtooth or triangular pulse;
   an output node between, and in series with, the second p-type transistor and the third n-type transistor; and
   a third p-type transistor in parallel with the first and second p-type transistors;
   wherein a gate terminal of the third p-type transistor is coupled to the output node and a drain terminal of the third p-type transistor is coupled to the light-emission section.

7. The system of claim 6, wherein the in-pixel PWM circuitry further comprises:
   a fourth n-type transistor coupled in series with the second n-type transistor and the third n-type transistor, wherein a gate terminal of the fourth n-type transistor is controllable by a bias voltage, and the fourth n-type transistor is coupled to ground.

8. The system of claim 6, wherein the light-emission section includes a micro light-emitting diode.

9. The system of claim 6, wherein the drive circuit is a seven-transistor circuit.

10. The system of claim 6, wherein the PWM circuitry includes thin film transistors comprising at least one of: low temperature polysilicon, InP, GaP, GaN, or indium gallium zinc oxide.

11. The system of claim 6, wherein the first and second p-type transistors and the second and third n-type transistors form a differential amplifier.

12. An apparatus, comprising:
   a plurality of pixels arranged in a two-dimensional matrix, wherein an individual pixel of the plurality of pixels includes a light-emission section and a drive circuit to drive the light-emission section, wherein the drive circuit includes an in-pixel pulse-width modulation (PWM) circuitry which includes a plurality of n-type devices, and the plurality of n-type devices comprises:
   a first n-type device to receive input data, wherein the first n-type device is controllable by a scan signal;
   a second n-type device comprising a gate terminal which is coupled to the first n-type device by a capacitor;
   a third n-type device coupled to the second n-type device and the capacitor, wherein the third n-type device is controllable by a reset signal; and
   a fourth n-type device coupled to the third n-type device and the light-emission section, wherein the fourth n-type device is controllable by an enable signal; and
   one or more circuits coupled to the plurality of pixels to provide a sawtooth or triangular pulse to the in-pixel PWM circuitry of the individual pixel.

13. The apparatus of claim 12, wherein the plurality of n-type devices comprises indium gallium zinc oxide thin-film transistor.

14. The apparatus of claim 12, wherein the light-emission section comprises a micro-LED, and the in-pixel PWM circuitry is to convert the sawtooth or triangular pulse into a pulse width modulated signal to drive the micro-LED.

15. The apparatus of claim 12, wherein the plurality of n-type devices further comprises:
- a fifth n-type device coupled in series with the second n-type device, wherein a gate terminal and a drain terminal of the fifth n-type device are coupled to a power supply line; and
- a sixth n-type transistor having a gate terminal coupled to a node which is between, and in series with, the second n-type device and the fifth n-type device, wherein the sixth n-type device is coupled in series with the fourth n-type device.

16. The apparatus of claim 1, wherein the in-pixel PWM circuitry further comprises a circuit coupled between the first n-type transistor and the gate terminal of the second n-type transistor to compensate a threshold voltage of the second n-type transistor.

17. The apparatus of claim 1, further comprising one or more circuits coupled to the plurality of pixels to provide the sawtooth or triangular pulse and the data voltage.

18. The apparatus of claim 1, wherein the light-emission section comprises a plurality of micro light-emitting diodes coupled to the output node, and a current of the current pulse is divided among the plurality of micro light-emitting diodes.

19. The apparatus of claim 1, wherein the light-emission section comprises a plurality of micro light-emitting diodes coupled in parallel to the output node, and during each scan of a row of the two-dimensional matrix, the micro light-emitting diodes are sequentially illuminated, one at a time.

20. The system of claim 6, further comprising one or more circuits coupled to the plurality of pixels to provide the sawtooth or triangular pulse and the input data.

21. The system of claim 6, wherein a current in the third p-type transistor increases when a voltage of the input data increases.

22. The system of claim 6, wherein a current in the third p-type transistor is generated based on a difference between currents in the first and second p-type transistors.

23. The apparatus of claim 12, wherein the scan signal is from a row driver of the two-dimensional matrix, and the sawtooth or triangular pulse is from a column driver of the two-dimensional matrix.

24. The apparatus of claim 12, wherein the sawtooth or triangular pulse is provided to the in-pixel PWM circuitry as the input data.

* * * * *

UNITED STATES PATENT AND TRADEMARK OFFICE
CERTIFICATE OF CORRECTION

PATENT NO. : 12,094,396 B2  
APPLICATION NO. : 17/127859  
DATED : September 17, 2024  
INVENTOR(S) : Khaled Ahmed Page 1 of 1

It is certified that error appears in the above-identified patent and that said Letters Patent is hereby corrected as shown below:

In the Claims

Column 37  
Line 53 "…less than 30 μm×30 μmm." should read --…less than 30 μm×30 μm.--

Column 39  
Lines 2-3 "…thin-film transistor." should read --…thin-film transistors.--

Signed and Sealed this  
Second Day of September, 2025

Coke Morgan Stewart  
*Acting Director of the United States Patent and Trademark Office*